US012673864B2

(12) United States Patent
Littrell

(10) Patent No.: US 12,673,864 B2
(45) Date of Patent: Jul. 7, 2026

(54) ACOUSTIC TRANSDUCER WITH IMPROVED LOW-FREQUENCY RESPONSE

(71) Applicant: QUALCOMM Incorporated, San Diego, CA (US)

(72) Inventor: Robert John Littrell, Belmont, MA (US)

(73) Assignee: QUALCOMM Incorporated, San Diego, CA (US)

( * ) Notice: Subject to any disclaimer, the term of this patent is extended or adjusted under 35 U.S.C. 154(b) by 617 days.

(21) Appl. No.: 18/053,669

(22) Filed: Nov. 8, 2022

(65) Prior Publication Data

US 2023/0143656 A1 May 11, 2023

Related U.S. Application Data

(60) Provisional application No. 63/277,325, filed on Nov. 9, 2021.

(51) Int. Cl.
B81B 3/00 (2006.01)

(52) U.S. Cl.
CPC .... B81B 3/0021 (2013.01); *B81B 2201/0257* (2013.01); *B81B 2203/0118* (2013.01); *B81B 2203/04* (2013.01)

(58) Field of Classification Search
CPC ...... H04R 7/06; H04R 17/02; H04R 2410/03; H04R 17/025; H04R 2207/021; H04R 2201/003; B81B 3/0021; B81B 2201/0257; B81B 2203/0118; B81B 2203/04
See application file for complete search history.

(56) References Cited

U.S. PATENT DOCUMENTS

| | | | |
|---|---|---|---|
| 2015/0350792 A1* | 12/2015 | Grosh | H10N 30/50 |
| | | | 257/416 |
| 2019/0289405 A1 | 9/2019 | Littrell et al. | |
| 2022/0141596 A1 | 5/2022 | Lin et al. | |

(Continued)

FOREIGN PATENT DOCUMENTS

| | | | |
|---|---|---|---|
| JP | 2019161030 A | 9/2019 | |
| JP | 2020136385 A * | 8/2020 | H04R 17/02 |

OTHER PUBLICATIONS

International Search Report and Written Opinion—PCT/US2022/079586—ISA/EPO—Feb. 22, 2023.

*Primary Examiner* — Moazzam Hossain
(74) *Attorney, Agent, or Firm* — Polsinelli

(57) ABSTRACT

Aspects of acoustic transducers are described. One aspect is a microelectromechanical (MEMS) transducer comprising a substrate and multiple cantilevered beams. A first cantilevered beam comprises a first protrusion and a first piezoelectric structure, where the first piezoelectric structure comprises a first deflection end and a first fixed end, where the first fixed end is coupled to the substrate, and where the first deflection end is cantilevered away from the substrate. The first cantilevered beam is separated from a second cantilevered beam by a gap. The first protrusion is disposed at the first deflection end and increases a thickness of the first cantilevered beam along the gap at the first deflection end. A second protrusion of the second beam is disposed at a second deflection end and increases a thickness of the second cantilevered beam along the gap at the second deflection end.

22 Claims, 17 Drawing Sheets

TOP VIEW

(56)     References Cited

U.S. PATENT DOCUMENTS

| | | | |
|---|---|---|---|
| 2022/0396470 A1* | 12/2022 | Leahy | B81B 3/0021 |
| 2023/0007405 A1* | 1/2023 | Qian | H04R 17/02 |
| 2023/0011561 A1* | 1/2023 | Qian | H04R 31/00 |
| 2023/0130082 A1* | 4/2023 | Qian | H10N 30/306 |
| | | | 310/328 |

* cited by examiner

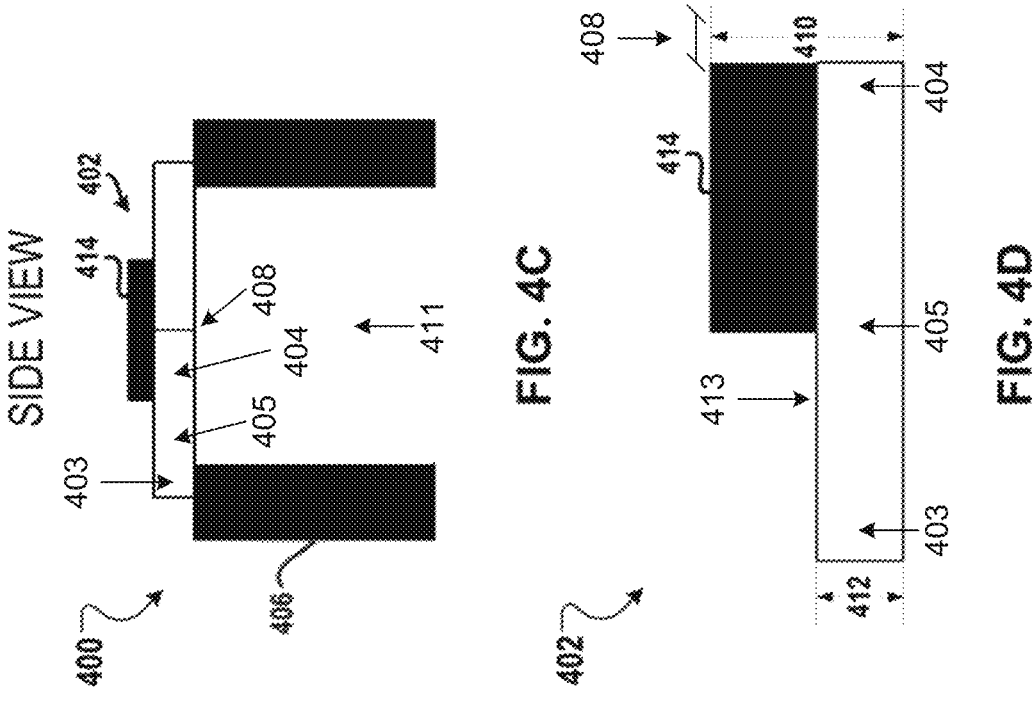
SIDE VIEW
FIG. 4C
FIG. 4D
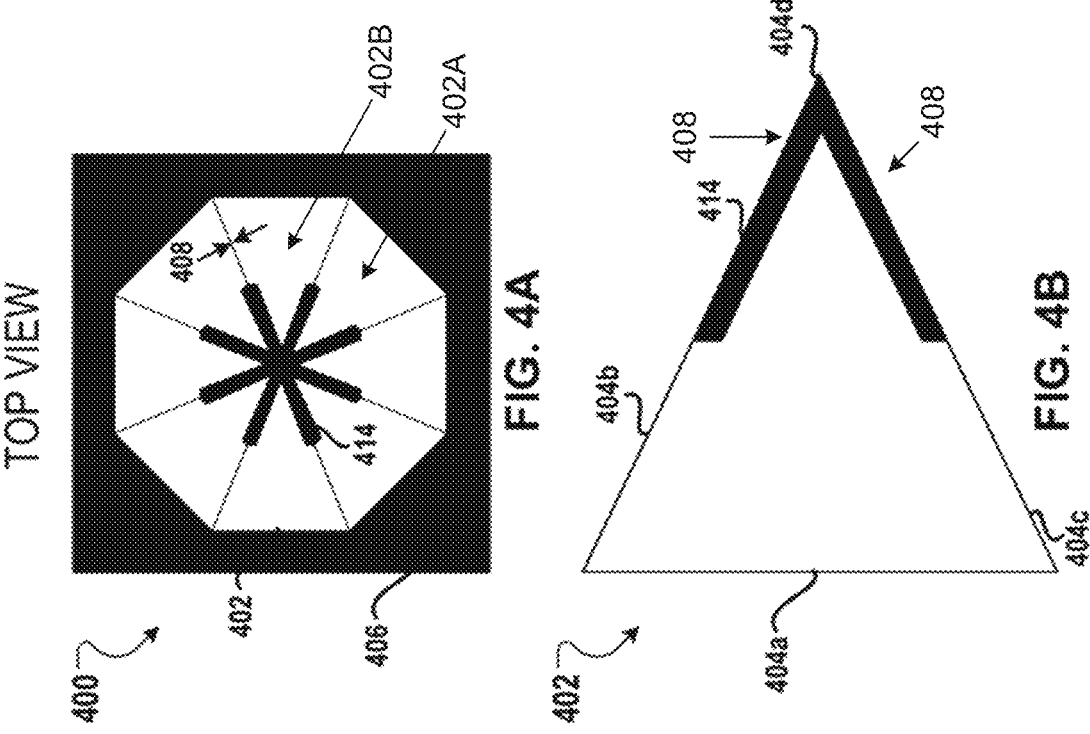
TOP VIEW
FIG. 4A
FIG. 4B

SIDE VIEW

BOTTOM VIEW

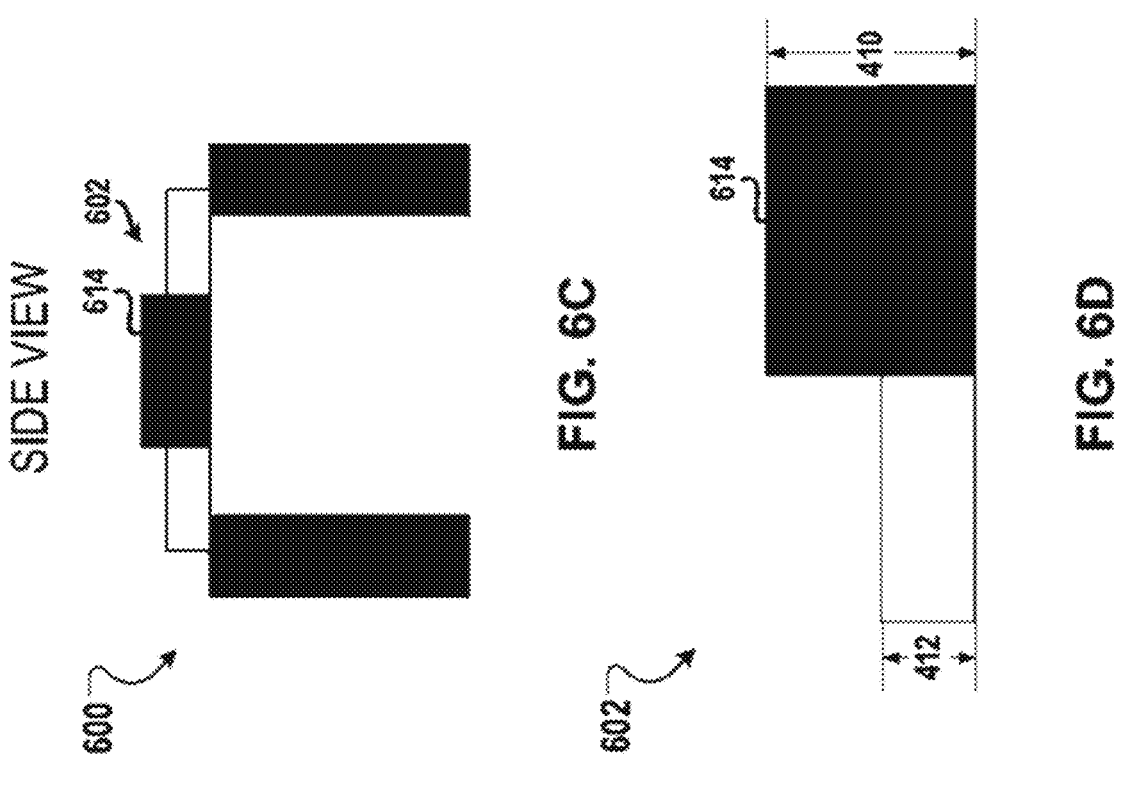
SIDE VIEW
FIG. 6C
FIG. 6D
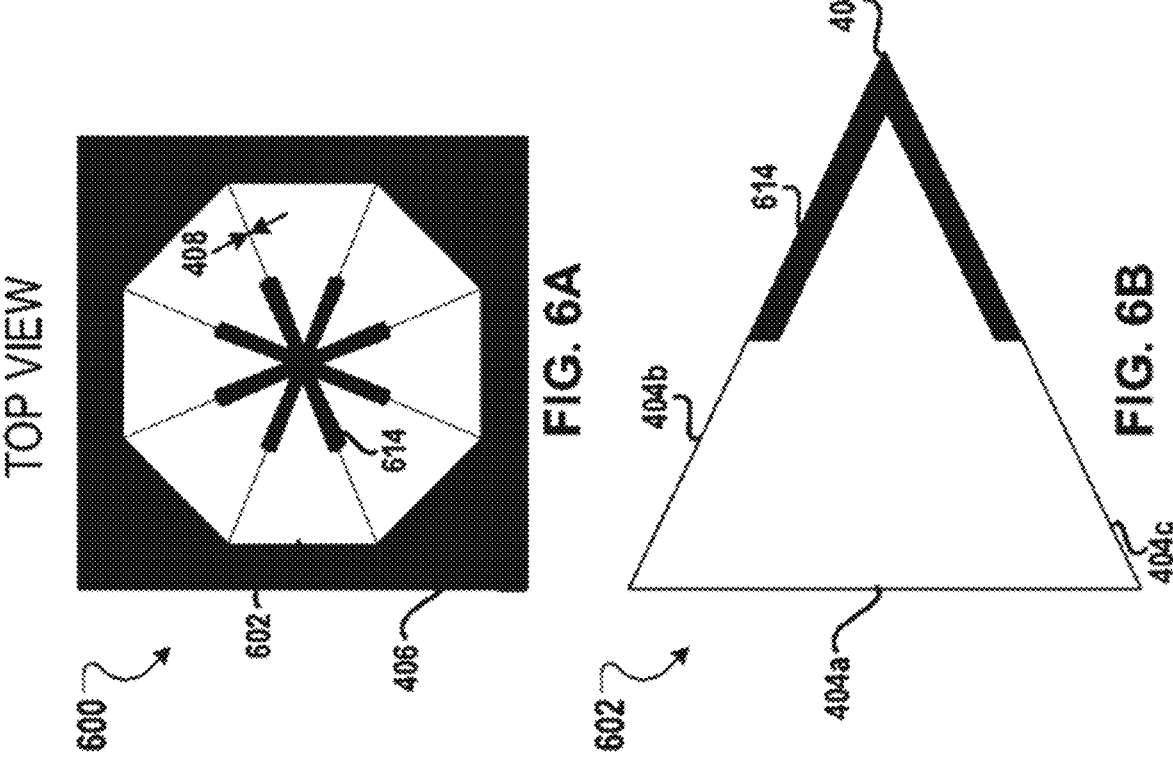
TOP VIEW
FIG. 6A
FIG. 6B

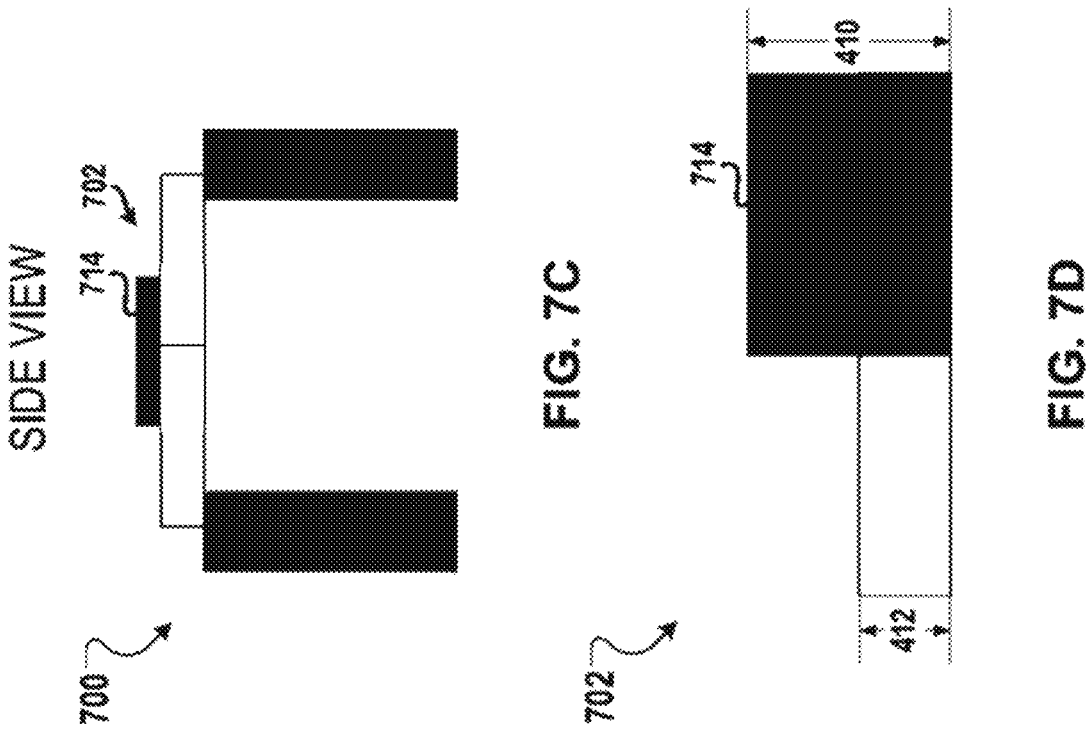
SIDE VIEW
FIG. 7C
FIG. 7D
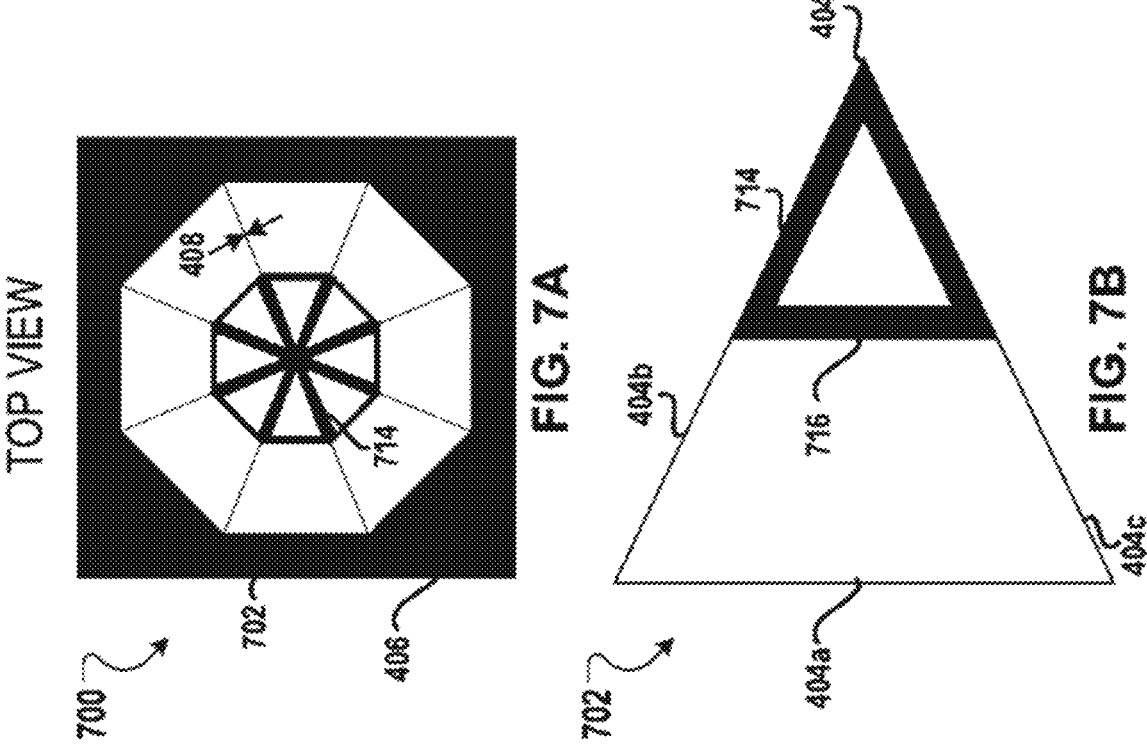
TOP VIEW
FIG. 7A
FIG. 7B

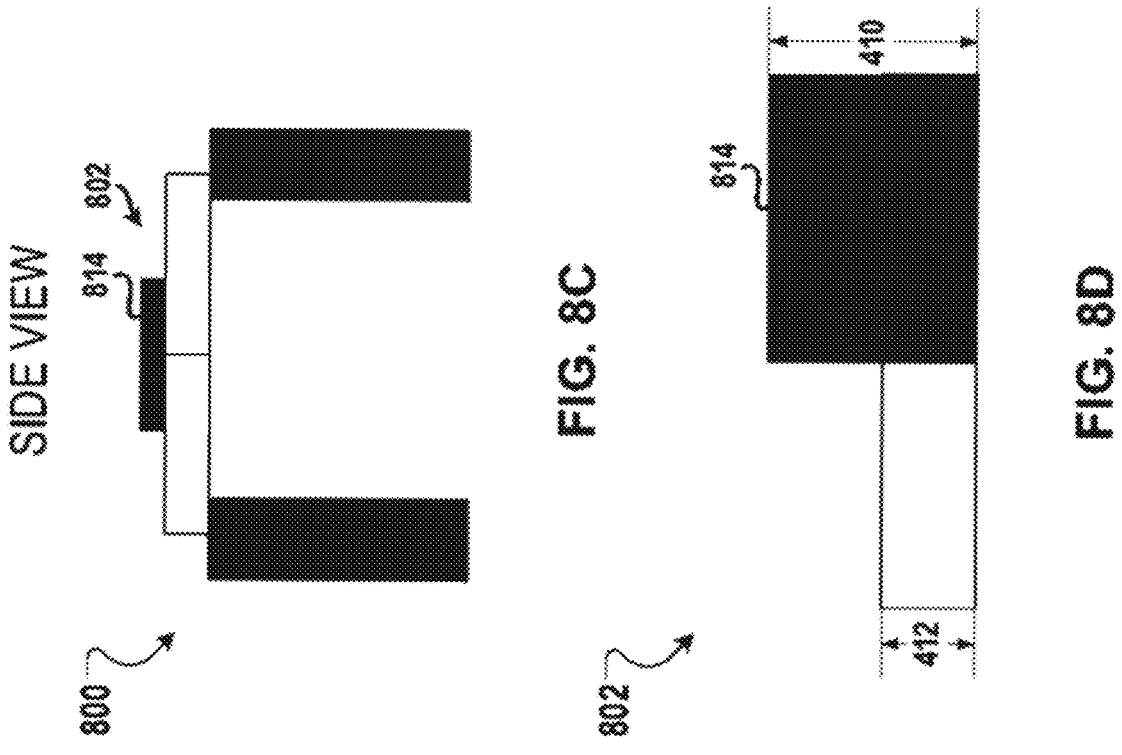
FIG. 8C
FIG. 8D
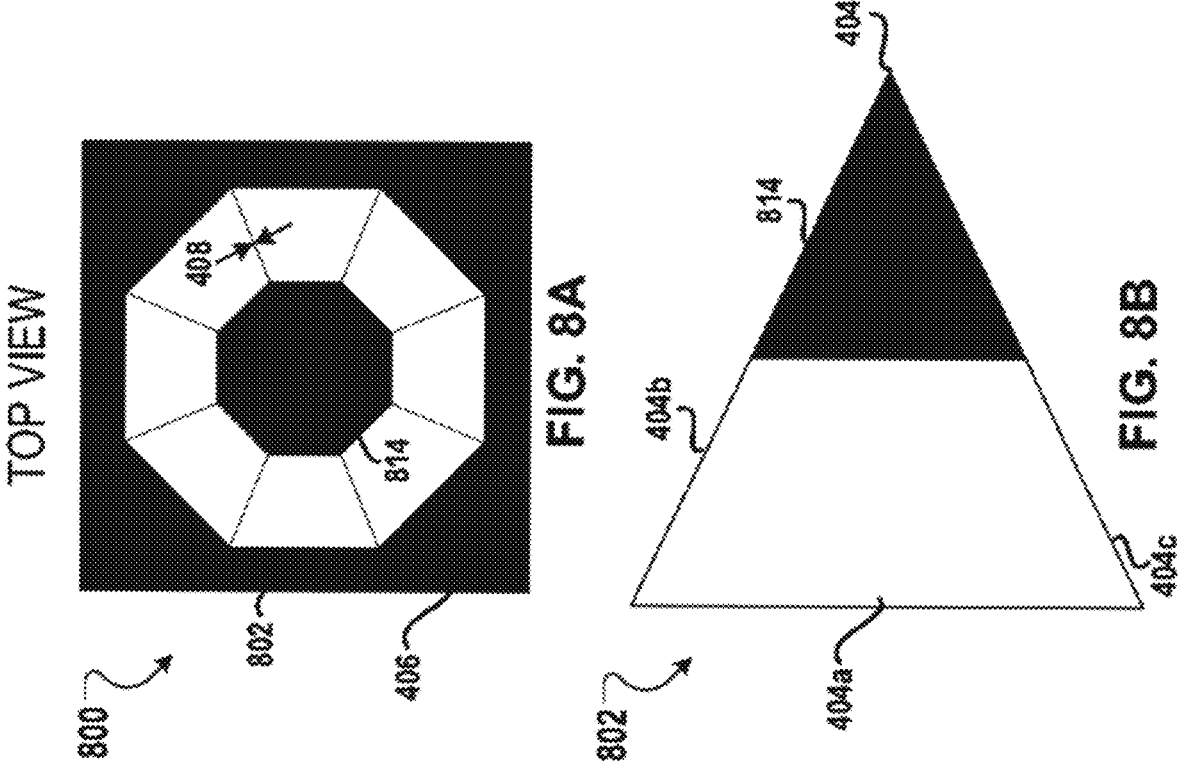
FIG. 8A
FIG. 8B

900

902

Deposit Alternating Layers Of Electrode And Piezoelectric Onto A Substrate

904

Form The Deposited Layers To Define A Pair Of Cantilevered Beams Having A Gap-Controlling Protrustion

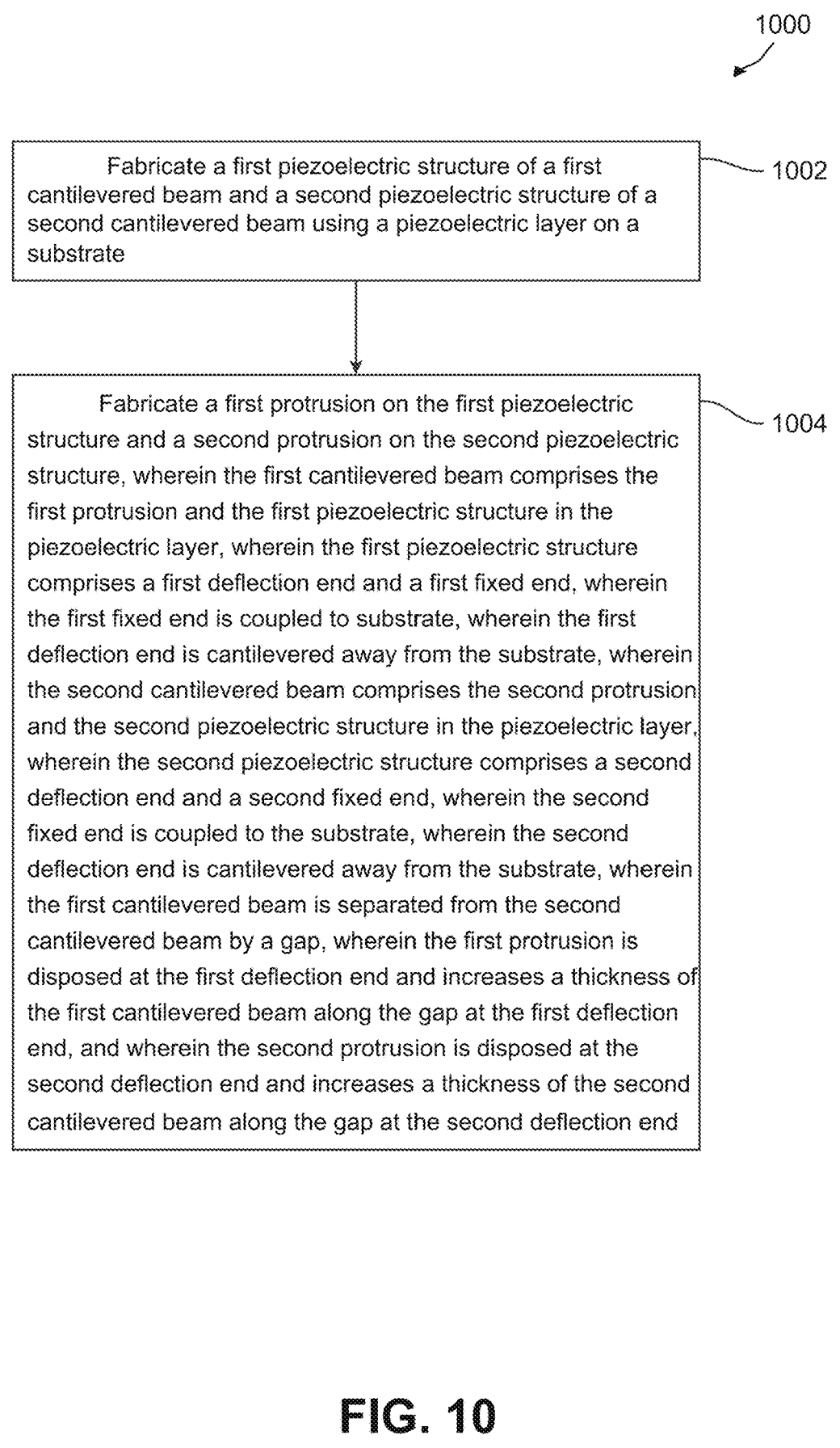

1000

Fabricate a first piezoelectric structure of a first cantilevered beam and a second piezoelectric structure of a second cantilevered beam using a piezoelectric layer on a substrate ～ 1002

Fabricate a first protrusion on the first piezoelectric structure and a second protrusion on the second piezoelectric structure, wherein the first cantilevered beam comprises the first protrusion and the first piezoelectric structure in the piezoelectric layer, wherein the first piezoelectric structure comprises a first deflection end and a first fixed end, wherein the first fixed end is coupled to substrate, wherein the first deflection end is cantilevered away from the substrate, wherein the second cantilevered beam comprises the second protrusion and the second piezoelectric structure in the piezoelectric layer, wherein the second piezoelectric structure comprises a second deflection end and a second fixed end, wherein the second fixed end is coupled to the substrate, wherein the second deflection end is cantilevered away from the substrate, wherein the first cantilevered beam is separated from the second cantilevered beam by a gap, wherein the first protrusion is disposed at the first deflection end and increases a thickness of the first cantilevered beam along the gap at the first deflection end, and wherein the second protrusion is disposed at the second deflection end and increases a thickness of the second cantilevered beam along the gap at the second deflection end ～ 1004

FIG. 10

ACOUSTIC TRANSDUCER WITH IMPROVED LOW-FREQUENCY RESPONSE

CROSS-REFERENCE TO RELATED APPLICATIONS

This application claims the benefit of U.S. Provisional Application No. 63/277,325, filed Nov. 9, 2021, titled "ACOUSTIC TRANSDUCER WITH IMPROVED LOW-FREQUENCY RESPONSE," which is hereby incorporated by reference, in entirety and for all purposes.

TECHNICAL FIELD

This disclosure relates generally to acoustic transducers, and more specifically to piezoelectric micro-electrical-mechanical systems (MEMS) acoustic transducers having an improved low-frequency response.

BACKGROUND

MEMS technology has enabled the development of smaller microphones and other acoustic transducers using wafer deposition techniques. In general, MEMS microphones can take various forms including, for example, capacitive microphones and piezoelectric microphones. Piezoelectric MEMS microphones may offer various advantages. For example, piezoelectric MEMS microphones may not require a backplate which eliminates squeeze film damping (an intrinsic noise source for capacitive MEMS microphones). In addition, piezoelectric MEMS microphones are reflow-compatible and can be mounted to a printed circuit board (PCB) using lead-free solder processing, which could irreparably damage other types of microphones. These advantages, and others, may be more fully realized by improved piezoelectric MEMS microphones, that for example, address high noise floors and improve microphone sensitivity.

SUMMARY

Various implementations of systems, methods, and devices within the scope of the appended claims each have several aspects, no single one of which is solely responsible for the desirable attributes described herein. Without limiting the scope of the appended claims, some prominent features are described herein. Aspects described herein include devices, wireless communication apparatuses, circuits, and modules supporting piezoelectric MEMS transducers.

One aspect is a microelectromechanical (MEMS) transducer. The MEMS transducer comprises a substrate; a first cantilevered beam comprising a first protrusion and a first piezoelectric structure, wherein the first piezoelectric structure comprises a top surface, a bottom surface, a first side, a first end coupled to the substrate, and a second end cantilevered away from the substrate and the first end; and a second cantilevered beam comprising a second protrusion and a second piezoelectric structure, wherein the second piezoelectric structure comprises a top surface, a bottom surface, a first side, a first end coupled to the substrate and a second end cantilevered away from the substrate and the first end; wherein the first cantilevered beam is positioned adjacent to the second cantilevered beam separated by a gap between the first side of the first piezoelectric structure and the first side of the second piezoelectric structure, with a corner of the first end of the first cantilevered beam coupled to the substrate separated from a corner of the first end of the second cantilevered beam coupled to the substrate by an initial gap distance, wherein the first side of the first piezoelectric structure and the first side of the second piezoelectric structure are separated by a gap distance; wherein the first protrusion is positioned on the top surface or the bottom surface of the first piezoelectric structure at the second end of the first piezoelectric structure along a top first side edge of the first cantilevered beam along the gap; and wherein the second protrusion is positioned on the top surface or the bottom surface at the second end of the second piezoelectric structure along a top first side edge of the second cantilevered beam along the gap.

Another aspect is a method. The method comprises fabricating a first piezoelectric structure of a first cantilevered beam and a second piezoelectric structure of a second cantilevered beam using a piezoelectric layer on a substrate; and fabricating a first protrusion on the first piezoelectric structure and a second protrusion on the second piezoelectric structure; wherein the first cantilevered beam comprises the first protrusion and the first piezoelectric structure in the piezoelectric layer, wherein the first piezoelectric structure comprises a first deflection end and a first fixed end, wherein the first fixed end is coupled to the substrate, wherein the first deflection end is cantilevered away from the substrate; wherein the second cantilevered beam comprises the second protrusion and the second piezoelectric structure in the piezoelectric layer, wherein the second piezoelectric structure comprises a second deflection end and a second fixed end, wherein the second fixed end is coupled to the substrate, wherein the second deflection end is cantilevered away from the substrate; wherein the first cantilevered beam is separated from the second cantilevered beam by a gap; wherein the first protrusion is disposed at the first deflection end and increases a thickness of the first cantilevered beam along the gap at the first deflection end; and wherein the second protrusion is disposed at the second deflection end and increases a thickness of the second cantilevered beam along the gap at the second deflection end.

Another aspect is a microelectromechanical (MEMS) transducer. The MEMS transducer comprises a substrate; a first cantilevered beam comprising a first protrusion and a first piezoelectric structure, wherein the first piezoelectric structure comprises a first deflection end and a first fixed end, wherein the first fixed end is coupled to the substrate, and wherein the first deflection end is cantilevered away from the substrate; a second cantilevered beam comprising a second protrusion and a second piezoelectric structure, wherein the second piezoelectric structure comprises a second deflection end and a second fixed end, wherein the second fixed end is coupled to the substrate, and wherein the second deflection end is cantilevered away from the substrate; wherein the first cantilevered beam is separated from the second cantilevered beam by a gap; wherein the first protrusion is disposed at the first deflection end and increases a thickness of the first cantilevered beam along the gap at the first deflection end; and wherein the second protrusion is disposed at the second deflection end and increases a thickness of the second cantilevered beam along the gap at the second deflection end.

Some such aspects are configured where the first piezoelectric structure is disposed in a plane of a piezoelectric layer and configured to deflect away from the plane of the piezoelectric layer at the first deflection end in response to acoustic vibrations on the first cantilevered beam; and the second piezoelectric structure is disposed in the plane of the piezoelectric layer and configured to deflect away from the plane of the piezoelectric layer at the second deflection end in response to the acoustic vibrations on the second cantilevered beam.

Some such aspects further comprise an acoustic port configured to provide an acoustic path from outside the MEMS transducer to the first cantilevered beam and the second cantilevered beam.

Some such aspects are configured where the first protrusion is disposed on a top surface of the first piezoelectric structure parallel to a plane of a piezoelectric layer on an opposite side of the plane of the piezoelectric layer from the acoustic port.

Some such aspects are configured where the first protrusion extends less than one third of a distance from the first deflection end toward the substrate.

Some such aspects are configured where the first protrusion covers a surface of the first piezoelectric structure at the first deflection end of the first piezoelectric structure.

Some such aspects are configured where the first protrusion covers an outline of a surface of the first piezoelectric structure at the first deflection end of the first piezoelectric structure.

Some such aspects are configured where the first cantilevered beam further comprises: a first electrode layer disposed on a top surface of the first fixed end of the first piezoelectric structure; and a second electrode layer disposed on a bottom surface of the first fixed end of the first piezoelectric structure, wherein the bottom surface is parallel to the top surface of the first fixed end of the first piezoelectric structure on an opposite side of the first piezoelectric structure.

Some such aspects are configured where the first electrode layer and the second electrode layer extends less than two-thirds of a distance from the first fixed end toward the first deflection end.

Some such aspects are configured where the first protrusion is disposed on a bottom surface of the first piezoelectric structure parallel to a plane of a piezoelectric layer on a same side of the plane as the acoustic port, and wherein the first piezoelectric structure is fabricated in the plane of the piezoelectric layer.

Some such aspects further comprise a third cantilevered beam comprising a third protrusion and a third piezoelectric structure, wherein the third piezoelectric structure comprises a third deflection end and a third fixed end, wherein the third fixed end is coupled to the substrate, wherein the third deflection end is cantilevered away from the substrate; wherein the gap has an initial gap distance between the first fixed end and the second fixed end, and wherein the gap has a gap distance that varies based on a length along the gap away from the substrate; wherein the first cantilevered beam is separated from the third cantilevered beam by a second gap, wherein the second gap has the initial gap distance between the first fixed end and the third fixed end, and wherein the second gap has a second gap distance that varies based on a second length along the second gap away from the substrate, a deflection position of the first cantilevered beam, and a deflection position of the third cantilevered beam; and wherein the first protrusion further increases the thickness of the first cantilevered beam along the second gap at the first deflection end.

Some such aspects further comprise a plurality of cantilevered beams, each comprising a corresponding protrusion and a corresponding piezoelectric structure, wherein each corresponding piezoelectric structure comprises a corresponding deflection end and a corresponding fixed end, wherein each of the plurality of cantilevered beams is separated from a first adjacent cantilevered beam by a first corresponding gap and a second adjacent cantilevered beam by a second corresponding gap.

The foregoing, together with other features and embodiments, will become more apparent upon referring to the following specification, claims, and accompanying drawings.

BRIEF DESCRIPTION OF DRAWINGS

FIGS. 4A-4D illustrate an example acoustic transducer having an improved gap-controlling geometry in accordance with aspects described herein.

FIGS. 6A-6D illustrate an example acoustic transducer having an improved gap-controlling geometry in accordance with aspects described herein.

FIGS. 7A-7D illustrate an example acoustic transducer having an improved gap-controlling geometry in accordance with aspects described herein.

FIGS. 8A-8D illustrate an example acoustic transducer having an improved gap-controlling geometry in accordance with aspects described herein.

FIG. 10. illustrates a method associated with MEMS acoustic transducers in accordance with aspects described herein.

Like reference symbols in the various drawings indicate like elements.

DETAILED DESCRIPTION

Figure 1A:
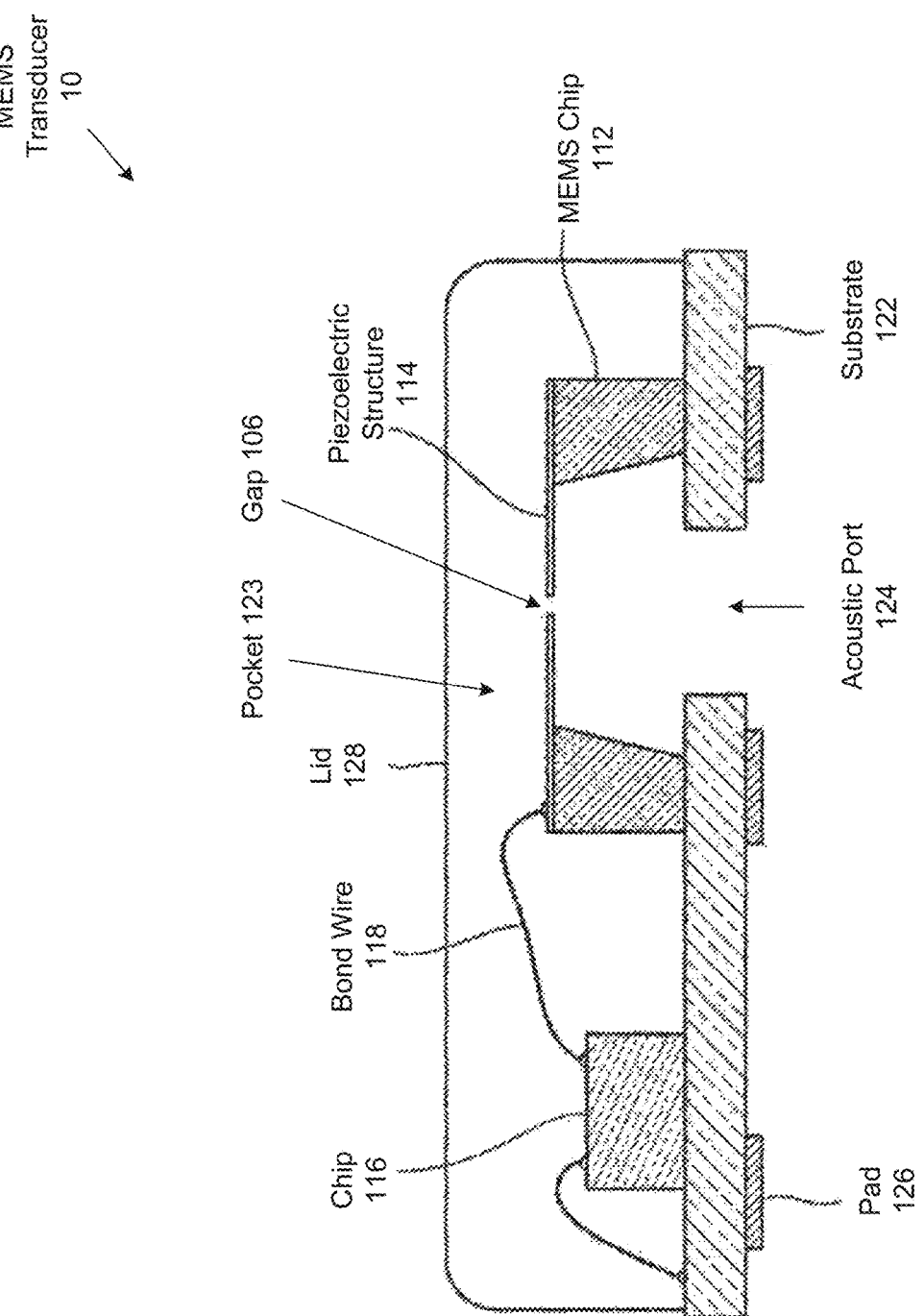
FIG. 1A illustrates an example of an acoustic transducer in accordance with aspects described herein.

The detailed description set forth below in connection with the appended drawings is intended as a description of example aspects and implementations and is not intended to represent the only implementations in which the invention may be practiced. The detailed description includes specific details for the purpose of providing a thorough understanding of the example aspects and implementations. In some instances, some devices are shown in block diagram form. Drawing elements that are common among the following figures may be identified using the same reference numerals.

Aspects described herein include piezoelectric microelectromechanical systems (MEMS) acoustic transducers. Such acoustic transducers convert acoustic energy into electrical signals. An example of a MEMS acoustic transducer is a MEMS microphone, which converts sound pressure into an electrical voltage. MEMS acoustic transducers as described herein can be made up of cantilevered beams over an air pocket and largely enclosing the air pocket so that an outside space and the air pocket are separated by the beams of the MEMS acoustic transducer. The air pressure differences between the air in the pocket and the air on the other side of the beams from the pocket (e.g., an outside area where an audio source creates air vibrations or sound) cause electrical signals in the piezoelectric MEMS transducer as the cantilevered beams are deflected based on the changes in air pressure.

Gaps between the beams allows air to pass from the outside area to the pocket enclosed by the MEMS acoustic transducer. Variations in manufacture of the beams and changes in deflection positions that occur due to stress in the beams that can cause the gaps to vary in size between different devices, which can impact MEMS acoustic transducer performance. Residual stress in MEMS transducers refers to stress forces that remain in a film (e.g., layer) after a film is deposited (e.g., on a silicon substrate). For example, a silicon wafer may be heated and a thin film may be deposited on the wafer at an elevated temperature, with the wafer then cooled back to a room temperature (e.g., a lower temperature). If the thin film has a different coefficient of thermal expansion than the silicon, the film will have residual stress at room temperature. The residual stress of sputtered films (e.g., such as certain piezoelectric layers in accordance with aspects described herein) can be adjusted by adjusting deposition parameters. Such parameters can include gas pressures and deposition power. Variations in devices that can occur in manufacturing, however, can result in piezoelectric MEMS transducers with residual stress characteristics that deflect cantilevered beams, despite design and manufacturing processes targeted to make the cantilevered beams level (e.g., flat with respect to a substrate) Certain piezoelectric MEMS microphones can suffer from high noise floors due in part to the effects of residual stress. For example, in microphones having a diaphragm constrained on all edges, residual stress can lead to high diaphragm tension that results in decreased microphone sensitivity. In some cantilevered designs, such as rectangular cantilever beam microphones, residual stress can cause the cantilever to bend away (e.g., upwards or downwards) from the substrate plane. The bending causes the gap between adjacent cantilevers to increase, thereby decreasing the acoustic resistance and resulting in an undesirable decrease in low-frequency sensitivity. Aspects described herein include MEMS acoustic transducers with cantilevered beams having gap-controlling structures (e.g., gap-controlling geometry) to reduce excessive gap variations between the beams, improving the performance of the MEMS transducer devices by reducing performance degradation due to such gaps.

FIG. 1A illustrates an example of an acoustic transducer in accordance with aspects described herein. FIG. 1A schematically shows a cross-sectional view of an acoustic sensor implemented as MEMS transducer 10 (e.g., a MEMS microphone). As shown, the MEMS transducer 10 of FIG. 1A includes a MEMS chip 112 which can include a die having piezoelectric structures 114, (e.g. cantilevers or diaphragms, to convert sound pressure into electrical signals), and an application-specific integrated circuit chip 116 to buffer and amplify the electrical signal generated by the MEMS chip 112. The MEMS chip 112 and ASIC chip and 116 are electrically connected by wire bonding 118, and mounted within the interior chamber of a package (although other packaging and connection techniques are possible). The package has a lid 128 and a substrate 122 (e.g., a printed circuit board). The printed circuit board and the MEMS substrate of the MEMS chip 112 form an acoustic port 124 for enabling sound pressure to access the piezoelectric structure(s) 114 of the MEMS chip 112 Multiple solder pads 126 are disposed on a bottom surface of the substrate 122 for solder connections of the MEMS transducer 10 as an element of additional devices. The MEMS transducer can, for example, be used in cell phones, laptop computers, portable microphones, smart home accessories, or any other such devices. A lid 128 can be used to form the housing of the microphone, to provide an air pocket 123 which provides one side of the air pressure differentiation that causes deflection and signal generation in the MEMS chip 112, and to mitigate electromagnetic interference (EMI).

As noted, the MEMS chip 112 may be formed from one or more piezoelectric cantilevers or diaphragms (discussed below). A cantilever based piezoelectric structure 114 provides a benefit of reduced die stress after the die is released during fabrication. On the other hand, a diaphragm structure of such a microphone chip 112 can requires more stress control in the fabrication process as minimal residual stress within the diaphragm can result in significant sensitivity degradation. Multiple cantilevers can be arranged to form a piezoelectric sensing structure, (e.g., an a square shape, a hexagon shape, an octagon shape, or some other shape as illustrated below in FIGS. 1B, 4A-8D, etc.).

FIG. 1A illustrates a structure with the MEMS chip 112 having an acoustic port 124 formed in the MEMS substrate. In other implementations, the MEMS substrate can be closed, with a pocket similar to the pocket 123 formed by a cavity below the piezoelectric structures 114 and the acoustic port 124 on the opposite side of the piezoelectric structure(s) 114 from the substrate 122. In other implementations, other such configurations of the acoustic port 124 can be used so long as a path for acoustic pressure to reach the piezoelectric structures 114 is present.

Additionally, rather than implement the system with two separate chips, some embodiments may implement both the MEMS chip 112 and ASIC 116 as part of the same die. Accordingly, discussion of separate chips is for illustrative purposes. In addition, in other embodiments the ASIC 116 may be implemented on a die in a separate package with one or more interconnects electrically coupling the MEMS chip to the ASIC 116.

As illustrated in FIG. 1A, gap 106 is present between the piezoelectric structure(s) 114 of the MEMS chip. As described above, variations in the gap 106 can result from different deflections in cantilevered ends of the piezoelectric structure (e.g., ends of cantilevered beams near the gap 106) causing variations in resonance characteristics and reducing device reliability and performance.

In order to combat the effects of variations in gaps between beams of the MEMS chip 112 (e.g., variations in the piezoelectric structure due to residual stress, manufacturing variations, etc.) on acoustic transducer performance, some transducer designs in accordance with aspects described herein, can include cantilevered beam(s) with gap-controlling geometry. Such gap-controlling geometry in a MEMS acoustic transducer design can be referred to as protrusions added to cantilevered beams to increase the thickness of the beams, particularly around a deflection end of the beam distant from where the beam attaches to a substrate.

Figure 1B:
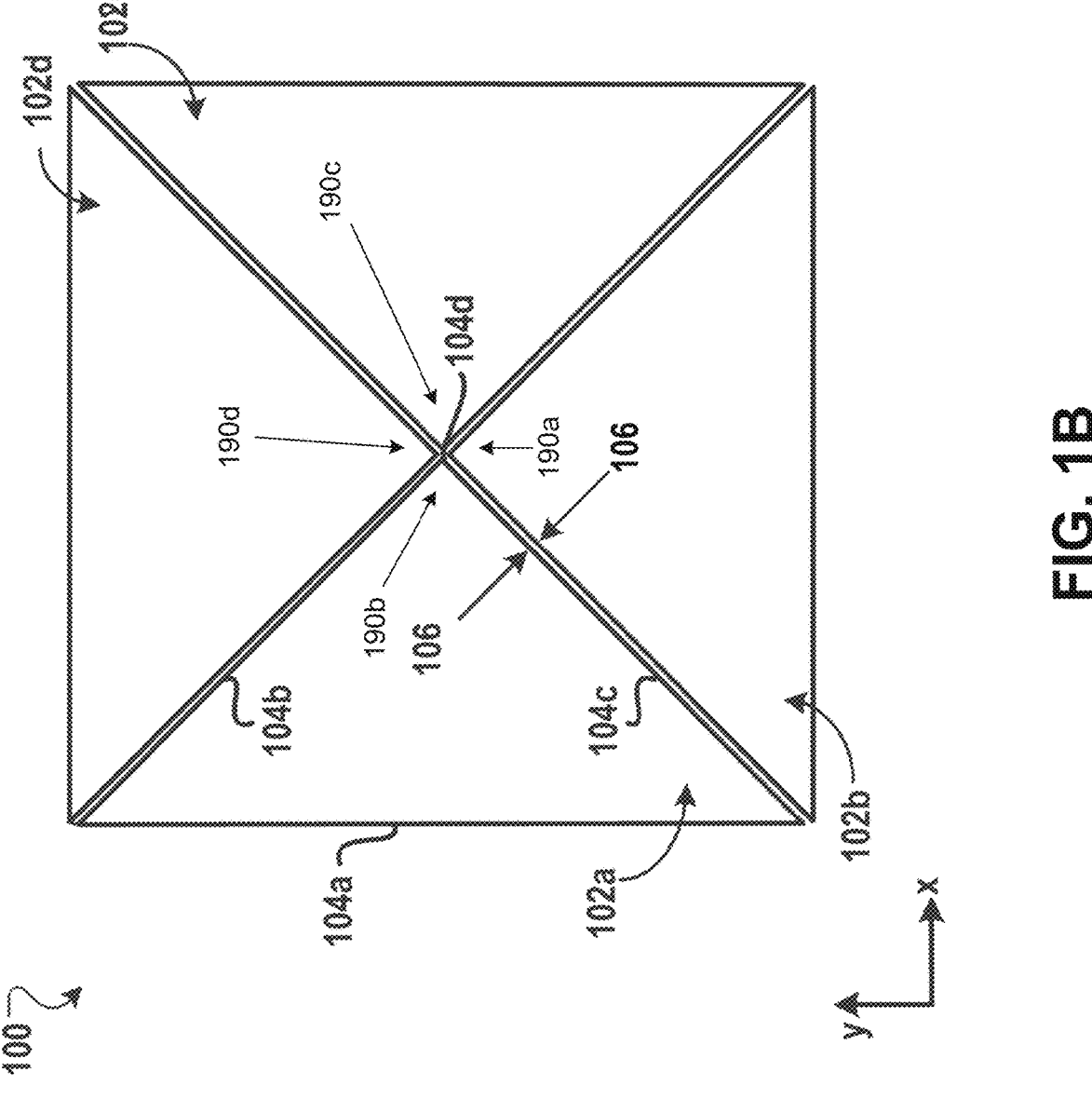
FIG. 1B illustrates elements of an acoustic transducer in accordance with aspects described herein.

FIG. 1B illustrates an acoustic transducer 100 in accordance with certain aspects of the present disclosure. In the example of FIG. 1B, the acoustic transducer 100 includes four cantilevered beams 102a, 102b, 102c, 102d (referred to collectively as cantilevered beams 102) each having a base 104a (e.g., a fixed end) that is fixed to a substrate (not shown, but similar to the MEMS substrate of the MEMS chip 112 of FIG. 1A) and sides 104b, 104c that are free from the substrate. The cantilevered beams 102a, 102b, 102c, and 102d each have deflection ends 190a, 190b, 190c, and 190d the center 104d. Each beam can be a beam similar to the beam 120 described in FIG. 1C below, or the beams of FIGS. 4A-8D. During operation, the cantilevered beams 102 move (e.g., deflect) in a z direction in and out of the illustrated x-y plane. The deflection is fixed at the outer edges that are attached to a substrate, such that gap distances between corner edges of adjacent cantilevered beams are static, and the deflection distance is greater at the deflection ends 190 near the center 104d as each beam deflects as part of vibrations due to acoustic vibrations and associated pressure differences that occur at the acoustic transducer 100. Due to residual stress, manufacturing variations, and other such influences, each of the beams 102 can have a tendency to deflect upwards or downwards upon release from the substrate (e.g., the resting deflection state can drift). The central or resting deflection position, or other deflection characteristics can be offset from a center position due to manufacturing variations, and can shift from a design target due to residual stress on the materials. However, the geometry of each beam 102 is such that a size of a gap 106 between the sides 104b, 104c of adjacent beams 102 remains small relative to, for example, a size of a gap between two facing rectangular cantilevers.

The size of the gap 106 is not always limited to or controlled by the separation distance between adjacent cantilevered beams 102. Variations across the beams 102 (e.g., due to material and manufacturing non-idealities, among others), can cause the beams 102 can have different amounts of vertical deflection. The difference in vertical deflection positions across adjacent cantilevered beams (sometimes referred to as vertical deflection mismatch) is undesirable because it can increase the size of the gap between adjacent beams, thereby reducing the acoustic resistance of the transducer and negatively impacting its low-frequency response.

Figure 1C:
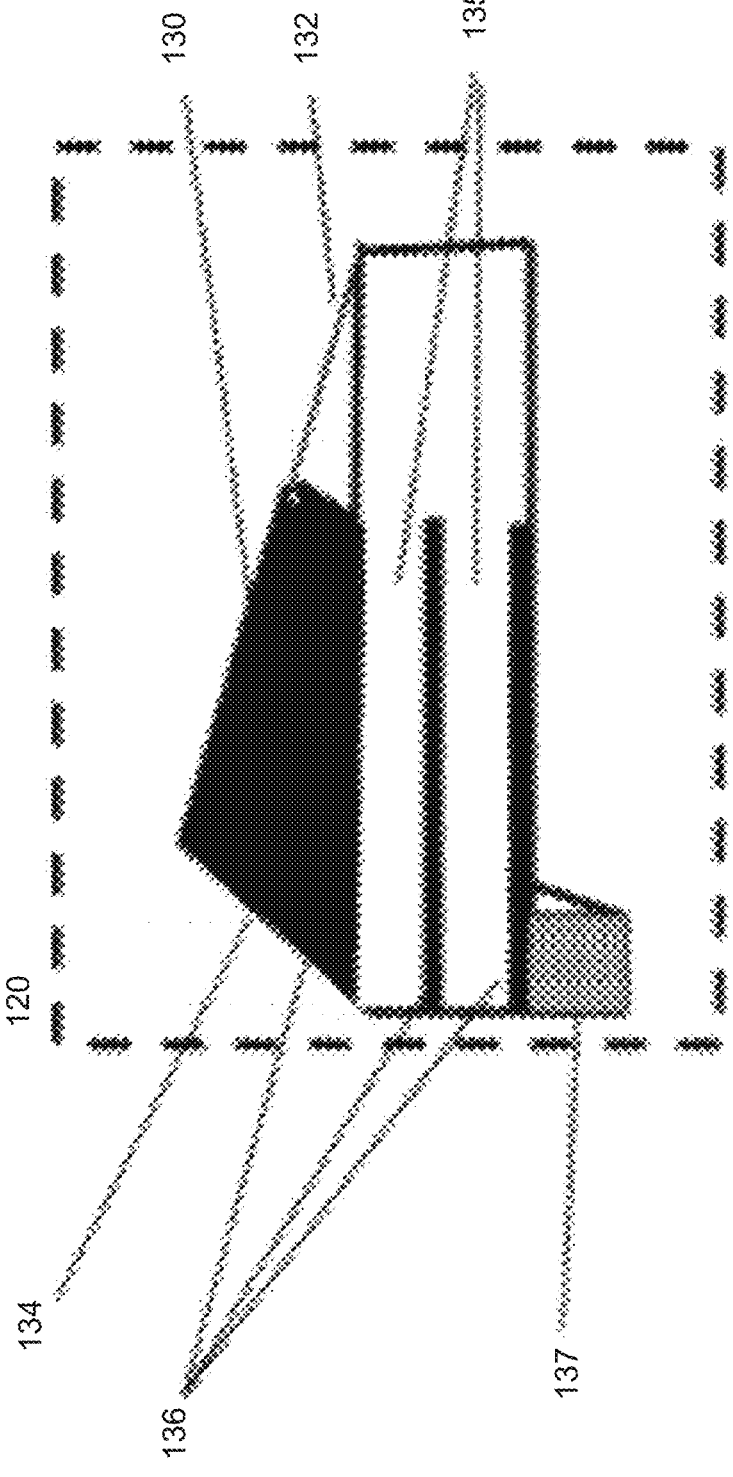
FIG. 1C is a perspective view of a portion of a piezoelectric transducer in accordance with embodiments described herein.

FIG. 1C is a perspective view of a portion 120 of a piezoelectric transducer in accordance with embodiments described herein. FIG. 1C illustrates a single cantilevered beam that can be part of a larger acoustic transducer as described herein. The cantilevered beam in the portion 120 is mounted on a substrate 137. In various implementations, the illustrated substrate 137 surface that is coupled to the cantilevered beam can be a top surface, a bottom surface, or any other surface that allows the beam to be cantilevered over an acoustic port to allow sound waves to make contact with the beam and displace the beam based on the pressure difference on opposite sides of the cantilevered beam. The cantilevered beam in the portion 120 has three electrode layers 136 that separate portions of the piezoelectric material that make up a first piezoelectric structure. The cantilevered beam has a first end 134 and a second end 132. A top surface visible in the perspective of FIG. 1C has the portion of the top surface two thirds of the way from the first end covered by one of the electrode layers 136. The second end 132 of the top surface does not have an electrode material, and is open so that a first protrusion (not shown) can be positioned along the second end 132 of the top surface first. A first side 135 is facing the perspective of FIG. 1C, and a second side 130 (not visible) faces away from the perspective of the FIG. 1C. The first end 134 is coupled to the substrate 137, and the second end 132 is cantilevered away from the substrate and the first end. The first side 135 and the second side 130 can each be separated from adjacent cantilevered beams having identical structure to the cantilevered beam of FIG. 1C. A plurality of such beams can be configured to enclose a symmetrical polygonal shape, wherein each corresponding piezoelectric structure has a same triangular shape in a shared piezoelectric layer (e.g., combining to form piezoelectric acoustic transducers such as those of FIGS. 4A-D, 5A-D, 6A-D, 7A-D, 8A-D, etc.). Each of the cantilevered beams of such an acoustic transducer comprises cantilevered beams such as the beam of FIG. 1C separated from adjacent beams by a gaps between the sides. In such a configuration the first cantilevered beam is positioned adjacent to the second cantilevered beam separated by a gap between the first side of the first piezoelectric structure and the first side of the second piezoelectric structure, with a corner of the first end of the first cantilevered beam coupled to the substrate separated from a corner of the first end of the second cantilevered beam coupled to the substrate by an initial gap distance, with the first side of the first piezoelectric structure and the first side of the second piezoelectric structure are separated by a gap distance. As will be further described below, in an implementation a first protrusion (not shown) is positioned on the top surface or the bottom surface of the first piezoelectric structure at the second end of the first piezoelectric structure along a top first side edge of the first cantilevered beam along the gap, and a second protrusion is positioned on the top surface or the bottom surface at the second end of the second piezoelectric structure along a top first side edge of the second cantilevered beam along the gap.

Such an acoustic transducer can include the cantilevered beam of the portion 120 along with a second cantilevered beam comprising a second protrusion (e.g., on a top surface of the beam similar to the second end 132 of the top surface of the beam of FIG. 1C) and a second piezoelectric structure (e.g., similar to the piezoelectric structure(s) between the electrode layers 136 of the beam of FIG. 1C. Such a second piezoelectric structure comprises similar top and bottom surfaces, first and second sides, and first and second ends.

Figure 1D:
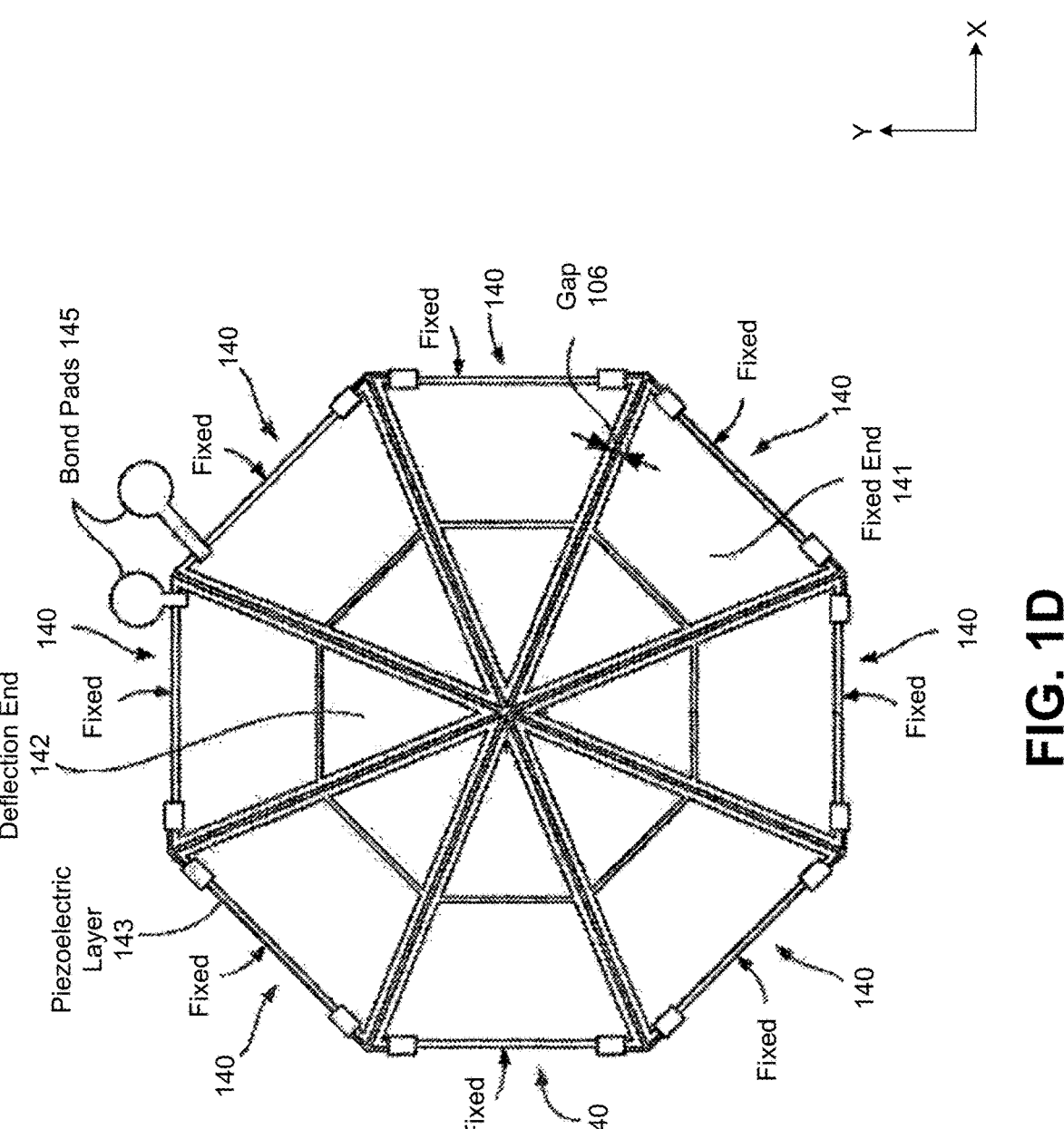
FIG. 1D illustrates perspectives of an acoustic transducer in accordance with aspects described herein.

FIG. 1D illustrates perspectives of an acoustic transducer in accordance with aspects described herein. FIG. 1D illustrates another configuration of a MEMS acoustic transducer having eight cantilevered beams 140. Each cantilevered beam 140 has a piezoelectric structure formed in a piezoelectric layer 143, with the structure of each of the eight cantilevered beams 140 having an associated fixed end 141 and an associated deflection end 142. In some implementations, the immobile portion of the fixed end 141 is approximately 10 micrometers (um) of a 400 um long beam, with the remaining portion of the fixed end 141 bending along with the free end based on acoustic pressures applied across the cantilevered beams 140. The eight cantilevered beams 140 each have a similar triangle shape, with the triangle bases fixed to a substrate (not shown) at the extreme end of the fixed end of each cantilevered beam 140. Each cantilevered beam 140 is positioned with sides adjacent to sides of another of the cantilevered beams separated by the gap 106. The position of the eight cantilevered beams 140 with the gaps 106 creates a symmetrical polygon shape bounded by the fixed bases around the outside of the symmetrical polygon (e.g., an octagon, with one exterior side for each of the cantilevered beams 140). In other aspects, other shapes can be used, such as the square of FIG. 1B. In other implementations, MEMS acoustic transducers can include cantilevered beams with different beam shapes for the same transducer, so long as the fixed exterior edges attached to the substrate form an enclosed transducer that separates air on one side (e.g., a pocket side similar to the pocket 123) from air on another side (e.g., an acoustic port side similar to the acoustic port 124) using the cantilevered beams (e.g., the cantilevered beams 140) and gaps between the beams (e.g., the gap 106). The separation allows the pressure difference between the sides of the MEMS transducer to apply force to the beams and generate a signal that can be communicated to processing circuitry via the bond pads 145.

As illustrated in FIG. 1D, the cantilevered beams have an associated length, determined by the line segment from the tip of the deflection end 142 that is perpendicular to the fixed extreme end of the fixed end 141. The line segment extends from the fixed end 141 at the substrate to the tip of the deflection end 142. As described above, when sound vibrations are present at a surface of the deflection beams, the cantilevered beams will move due to the pressure (e.g., z direction movement in and out of the x-y plane illustrated in FIG. 1D. The movement in and out of this plane is referred to herein as vertical deflection. The deflection at the fixed end 141 will be less than the deflection at the deflection end 142, with the amount of deflection increasing along the distance of the line segment away from the substrate toward the tip of the deflection end 142. The electrodes that generate the electrical signals at the bond pads 145 in response to the acoustic vibrations on the cantilevered beams 140 can add rigidity to the cantilevered beams 140, and so in some implementations, placement of the electrodes can be limited to a space approximately two-thirds of the line segment distance from the fixed attachment to the substrate at the fixed end towards the tip of the deflection end 142 (e.g., limited to a fixed end). In some implementations, an electrode layer can cover a surface or x-y plane cross section of the entire illustrated fixed end 141 of each of the cantilevered beams. In other implementations, smaller electrode shapes can be used in a portion of the fixed end 141 of each of the cantilevered beams 140. In some aspects, the deflection end 142 of each of the cantilevered beams does not include electrode layers. The electrode layers do not extend to the tip of the free end 142 to avoid sensing free end movement in the deflection end (e.g., where the signal which is proportional to the stress in the cantilever) is lower. Protrusion elements can provide additional rigidity to the deflection end 142 which can improve the proportional sensing of the stress in the cantilever with additional rigidity at the fixed end 141. The greater vertical deflection at the deflection ends 142, however, can lead to deflection mismatches that can result in performance degradation as described herein. Aspects further detailed below can include protrusion elements in a protrusion layer of the deflection ends 142. The protrusion elements increase a thickness of each cantilevered beam along the gaps 106 in order to maintain air resistance characteristics of the gaps 106 when the vertical deflection mismatches between adjacent cantilevered beams become large enough that the air flow characteristics of the gaps 106 are impacted (e.g., allowing additional air through the gaps 106) in the absence of the additional thickness.

Figure 1E:
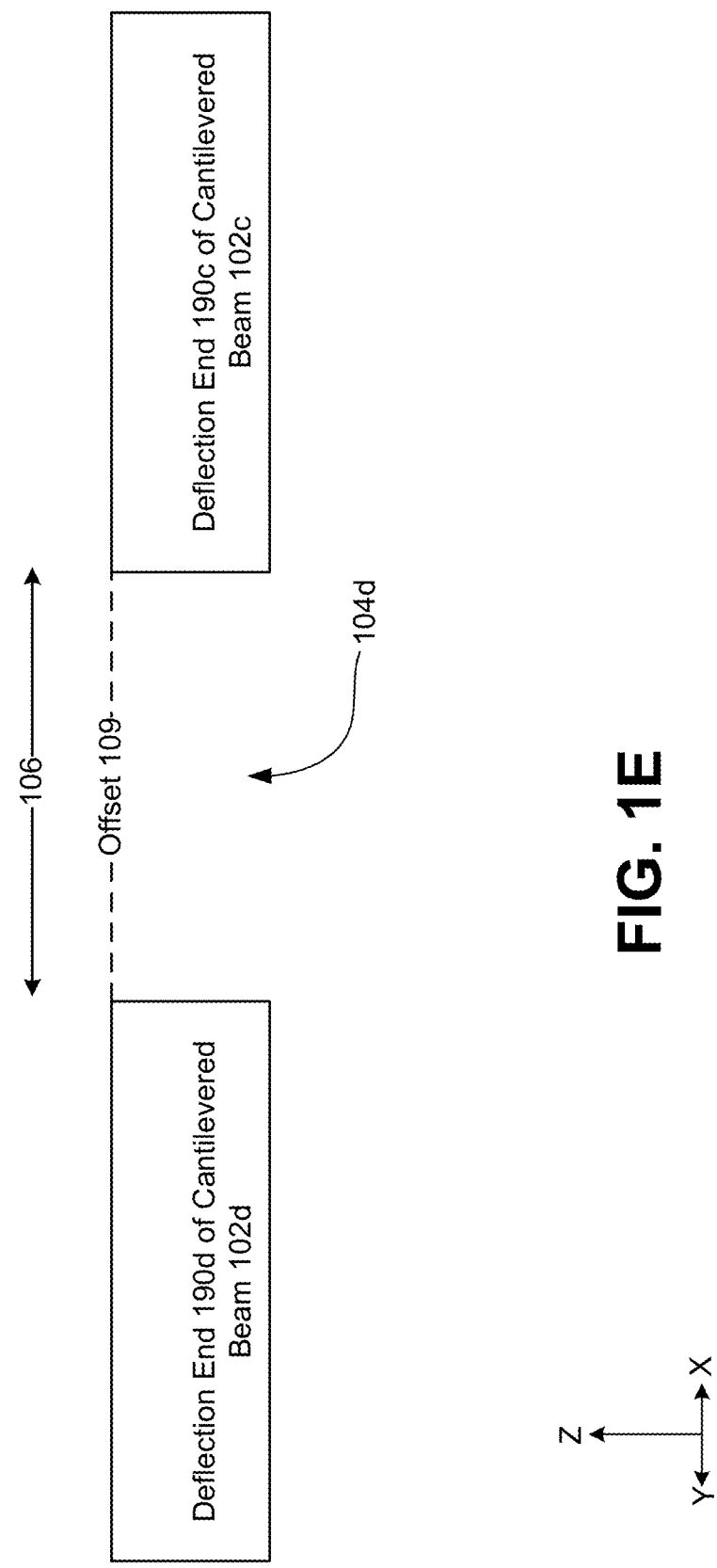
FIG. 1E illustrates elements of an acoustic transducer in accordance with aspects described herein.

FIG. 1E illustrates elements of an acoustic transducer in accordance with aspects described herein. FIG. 1E illustrates a side view of the cantilevered beams 102C and 102D at a position with no vertical offset, illustrated as the offset 109 (e.g., with zero or no illustrated offset value) across the gap 106 at the center 104d. As discussed above, during operation, the offset positions of the cantilevered beams 102C and 102d can match due to similar acoustic forces on the beams, but in real world operation, difference in vertical deflection can result in a nonzero offset 109. The nonzero value for the offset 109 (e.g., as illustrated in FIG. 2B) can result from manufacturing variations and residual stress on the cantilevered beams 102c, 102d as described above. Also as indicated, a large value for the offset 109 can cause performance degradation when the size of the gap 106 between adjacent beams becomes sufficient to change the air resistance through the gap 106, thereby reducing the acoustic resistance of the transducer and negatively impacting its low-frequency response.

Figure 2A:
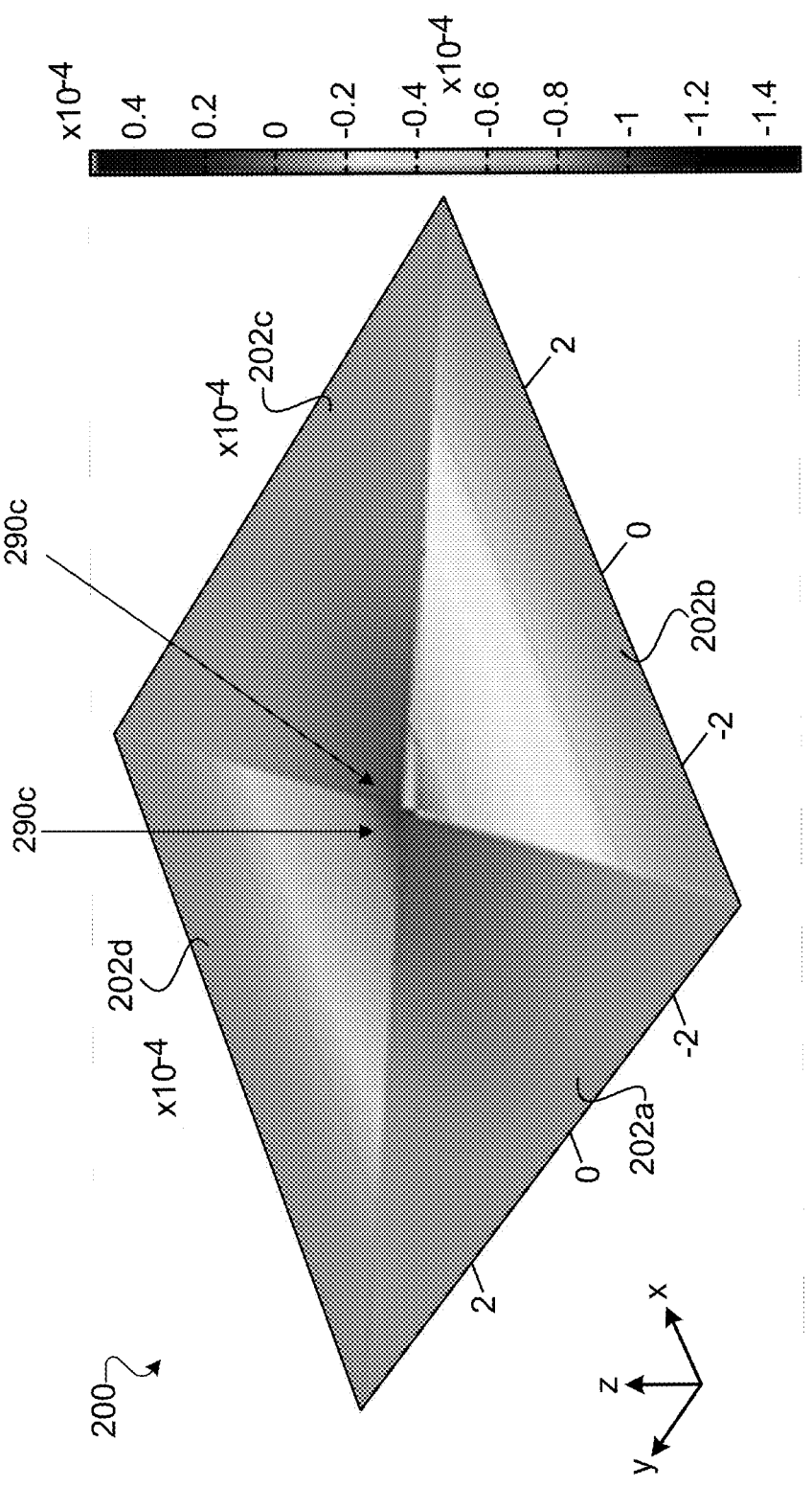
FIG. 2A illustrates a model of the deflection of cantilevered beams in accordance with aspects described herein.
Figure 2B:
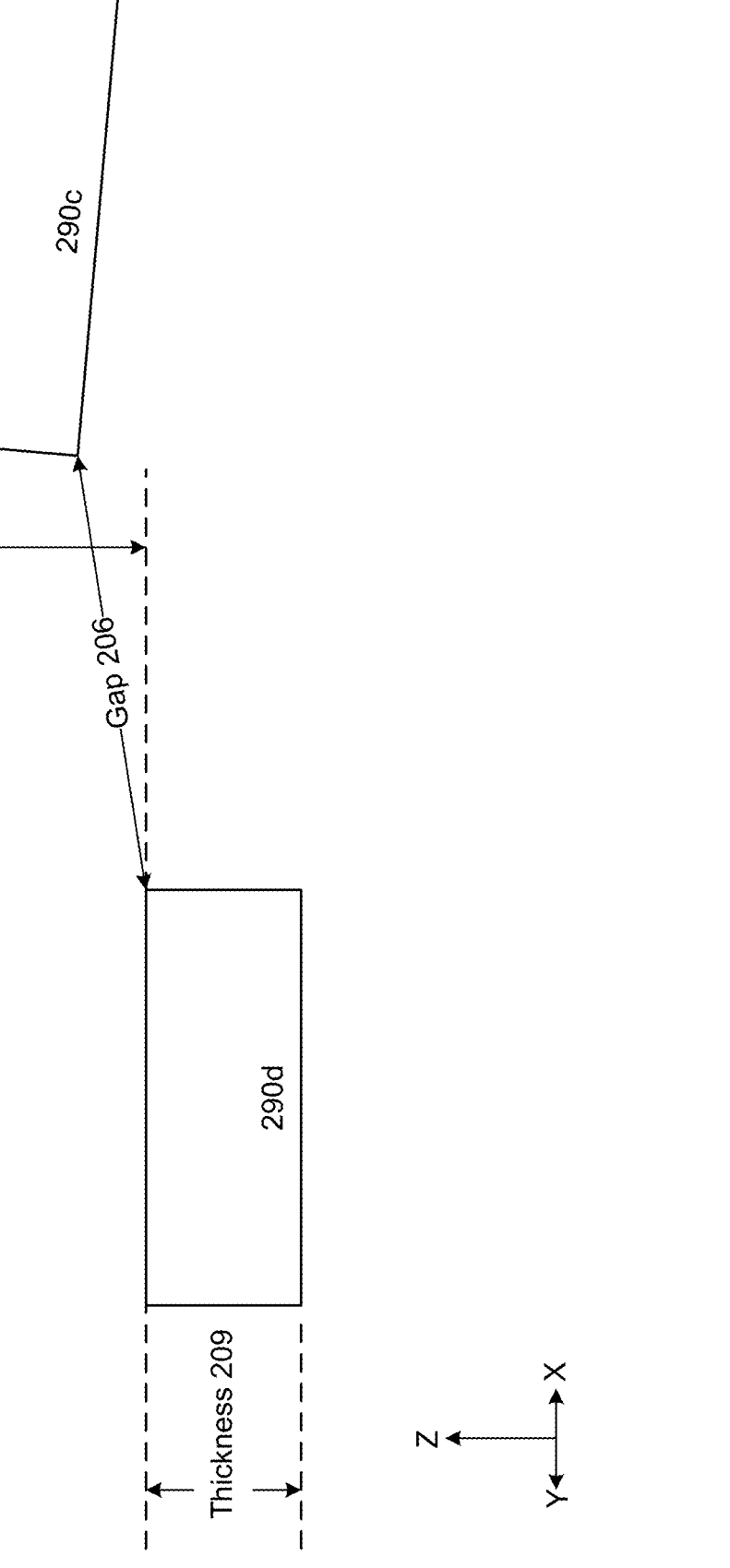
FIG. 2B illustrates elements of a model of the deflection of cantilevered beams in accordance with aspects described herein.

FIG. 2A additionally illustrates a model 200 of an acoustic transducer having a geometry similar to the acoustic transducer 100 that can be impacted by the offset 109 discussed above. In this example, the model 200 depicts the deflection experienced by four cantilevered beams 202a, 202b, 202c, 202d each having two 0.5 μm thick layers of aluminum nitride (AlN) stacked on top of each other. In this example, the residual stress for the bottom layer is 400 MPa in the X-direction and 435 MPa in the Y-direction, and the residual stress for the top layer is 400 MPa in both the X- and Y-directions. As such, the two opposing pairs of cantilevered beams 202 (e.g., beams 202a and 202c, and beams 202b and 202d) have the same vertical deflections. However, the differences in residual stress in the X- and Y-directions cause adjacent beams to have different vertical deflections, which can ultimately enlarge the gap between the adjacent beams. An offset between a deflection end 290c of the cantilevered beam 202c and a deflection end 290d of the cantilevered beam 202d is illustrated below.

FIG. 2B illustrates a model of the deflection offset 207 of cantilevered beams 202c, 202d in accordance with aspects described herein. As discussed above, the tips of the deflection ends of cantilevered beams move in a z direction more than other portions of cantilevered beams. Offsets that can occur in cantilevered beams have a greater impact at the tips of the deflection ends due to the geometry of the MEMS acoustic devices. FIG. 2B illustrates the deflection ends 290c, 290d of the corresponding cantilevered beams 202c, 202d. Each of the cantilevered beams 202c, 202d have a thickness 209, and when a vertical mismatch offset 207 is large enough relative to the gap 206 size and the value of the thickness 209 to impact the air resistance through the gap 206 (e.g., where the gap 206 at the maximum offset 207 is significantly larger than the gap 206 with no offset 207), the performance of the MEMS acoustic transducer is degraded.

Figure 2C:
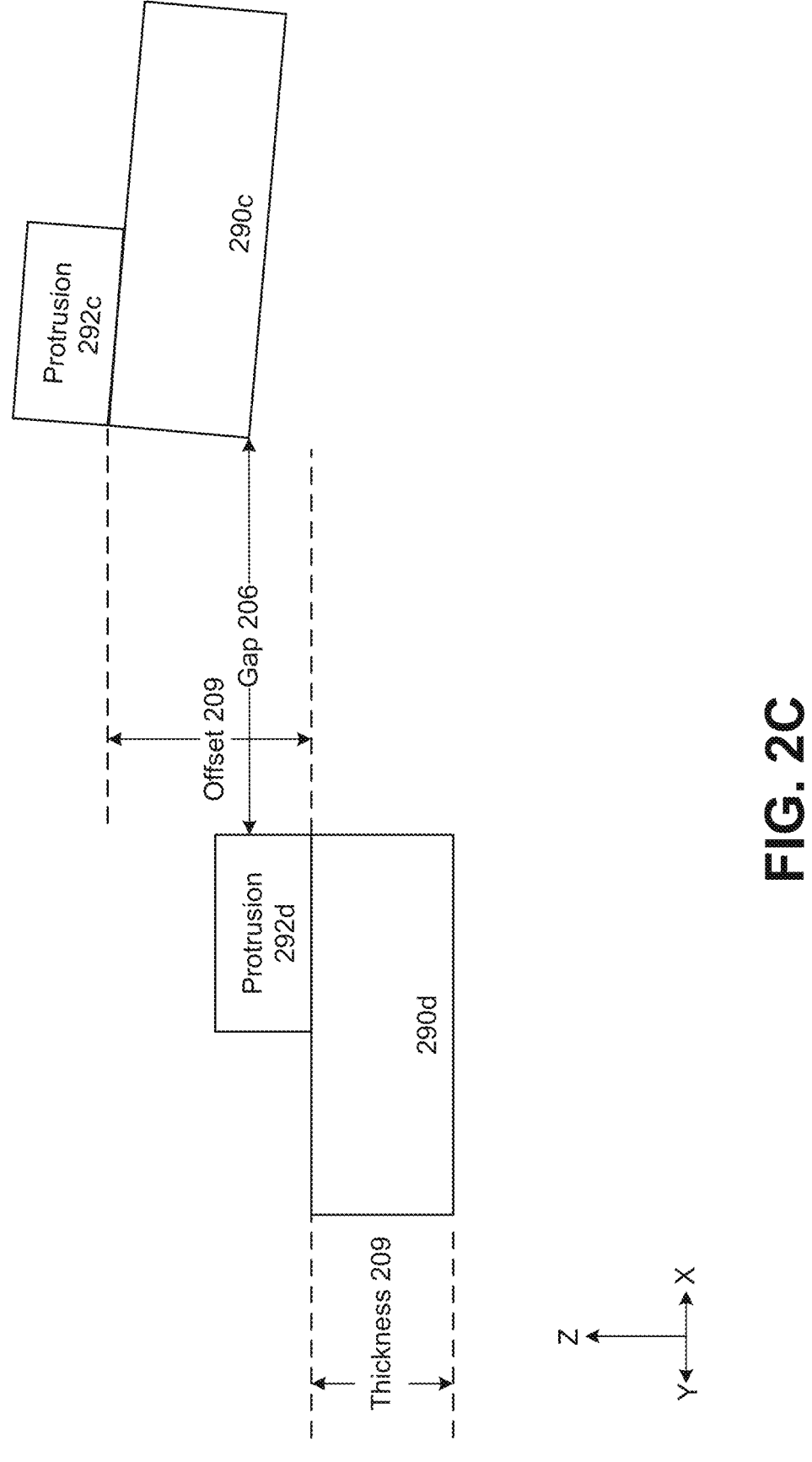
FIG. 2C illustrates elements of a model of the deflection of cantilevered beams in accordance with aspects described herein.

FIG. 2C illustrates a model of the deflection offset 207 of cantilevered beams 202c, 202d with added protrusions 292c, 292d a in accordance with aspects described herein. As illustrated, the added protrusions 292c, 292d along the gap 206 causes the gap distance to remain relatively constant at the maximum offset 207, which prevents the performance degradation discussed above. As described above, the gap distance where adjacent cantilevered beams attach to a shared substrate (e.g., an initial gap distance) will largely remain fixed, due to the attachment to the substrate. As the cantilevered beams extend away from the substrate toward the deflection ends (e.g., the free ends), the gap distance will increase when there is a vertical deflection mismatch.

Figure 3:
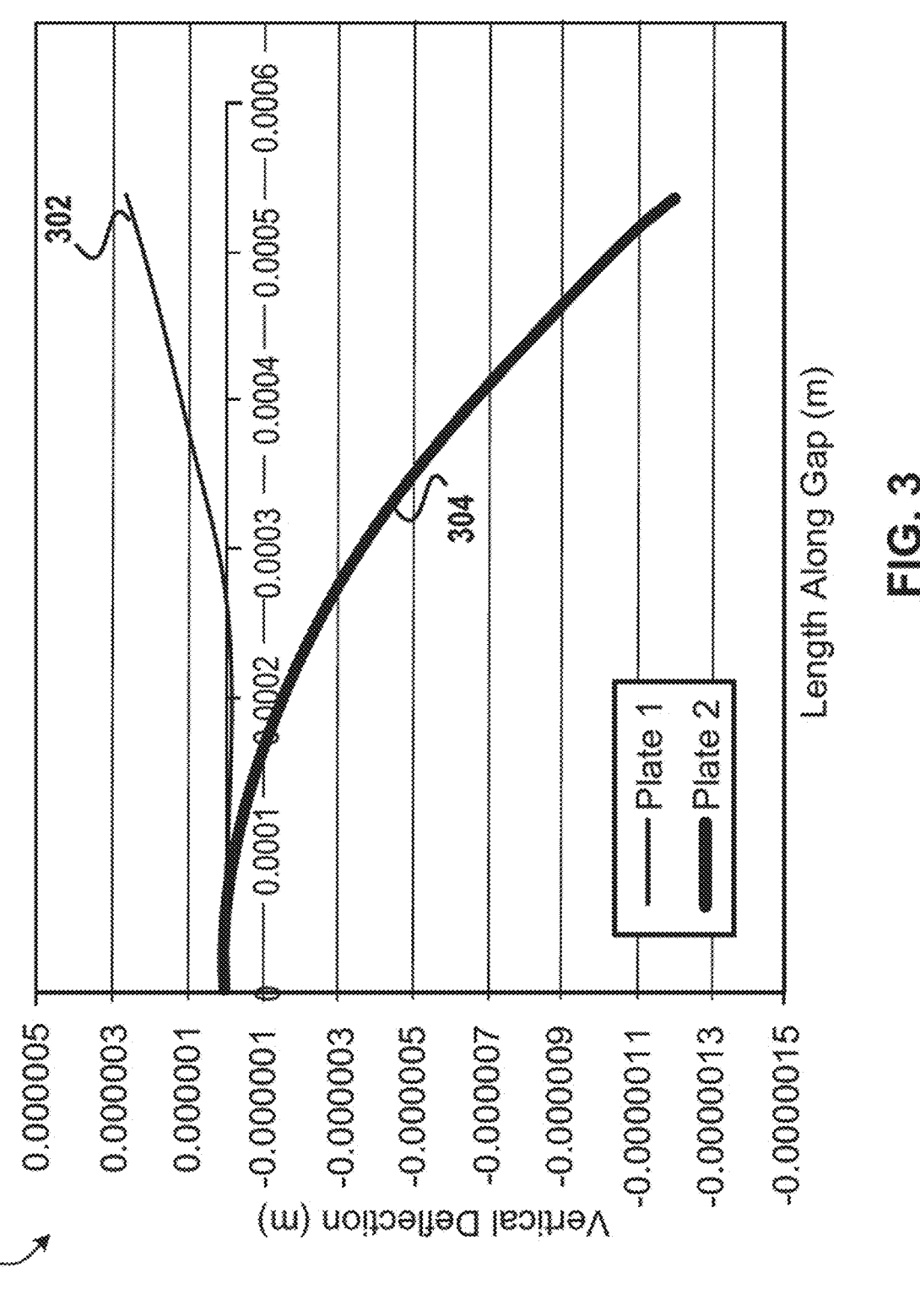
FIG. 3 illustrates a chart of the deflection of two adjacent cantilevered beams along a distance away from a fixed end toward a deflection end in accordance with aspects described herein.
Figures 5A, 5B, 5C, 5D:
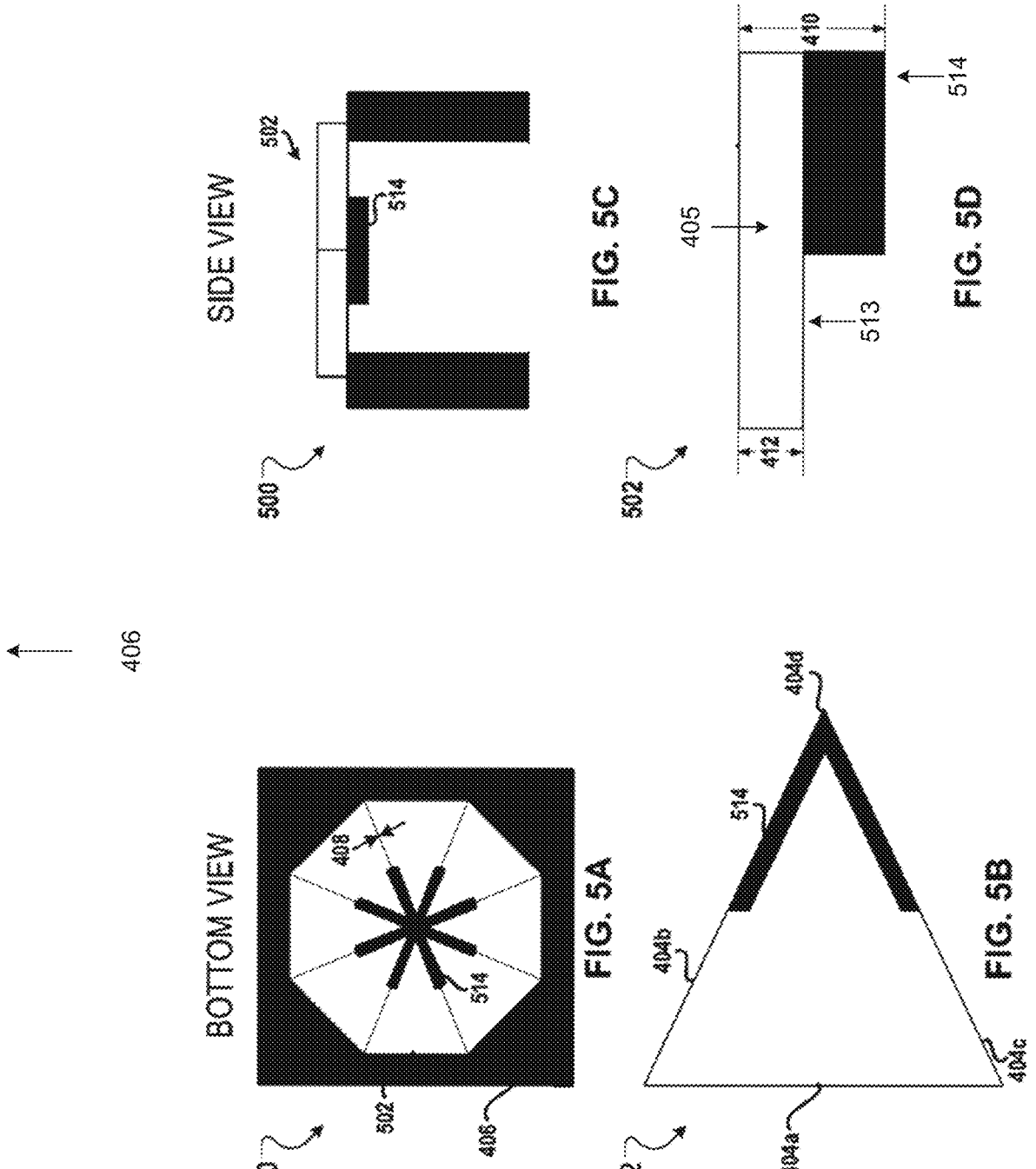
FIGS. 5A-5D illustrate an example acoustic transducer having an improved gap-controlling geometry in accordance with aspects described herein.

FIG. 3 shows a chart 300 illustrating modeled vertical deflection of two adjacent cantilevered beams (e.g., similar to the examples of FIGS. 2A, 2B, and 2C). In this example, a curve 302 depicts the vertical deflection of a first cantilevered beam (e.g., beam 202a) along a length of a gap between the first cantilevered beam and a second, adjacent cantilevered beam (e.g., beam 202b). A curve 304 depicts the vertical deflection of the second cantilevered beam along a length of the gap between the first cantilevered beam and the second cantilevered beam. When a vertical offset deflection occurs, the fixed ends of the cantilevered beams are largely fixed in position, with an offset determined during fabrication. The vertical offset results from a beam having a small angle or deflection out of the x-y plane and into the z plane. Along a beam having a vertical deflection, the value of the deflection increases along the length of the beam away from the fixed end attached to a supporting substrate and toward a tip of the beam at a deflection end. As can be seen from a comparison of the curves 302, 304, the gap between the two adjacent cantilevered beams in the example of FIG. 3 increases along the length, reaching a maximum of about 15 μm at the tips of the respective beams.

To reduce the effects of vertical deflection mismatch, the techniques described here provide for an acoustic transducer having cantilevered beams with an improved gap-controlling geometry. In particular, each cantilevered beam can include a protrusion (e.g., the protrusions 292c, 292d) disposed on a piezoelectric structure, with the added protrusions dimensioned to increase the thickness of the beam along at least a portion of the beam that is adjacent to another beam. By increasing the thickness of the beam in this way, the size of the gap between adjacent beams due to vertical deflection mismatch can be reduced relative to a size of the gap independent of the protrusion. As a result, the techniques described here improve transducer performance by, for example, enabling more precise control over the size of the gap between adjacent beams and, therefore, the transducer's acoustic resistance and low-frequency response (e.g., low-frequency roll off, or −3 dB frequency). The protrusions 292 can be produced by, for example, depositing material along the cantilevered beams 202 at the deflection ends 290. The protrusions 292 can cover the entire deflection end 290 (e.g., as in FIG. 8B), an outline of the deflection end 290 (e.g., as in FIG. 7B), or portions of the deflection end near the gap (e.g., as in FIGS. 4B, 5B, and 6B). The protrusion can be formed by depositing material at the deflection end 290 of a beam 202, removing (e.g., etching) material from the deflection end 290 of the beam 202, or combinations of such manufacturing processes. In general, the protrusion 292 can be formed using any suitable material, including metal, silicon nitride (Si3N4), silicon (Si), polysilicon, or combinations of Si3N4 and Si, among others.

FIGS. 4A-4D illustrate examples of an acoustic transducer 400 in accordance with an aspect of the present disclosure. In this example, the acoustic transducer 400 includes a plurality of cantilevered beams 402 configured to transform acoustic pressure into electronic signals. For example, the acoustic transducer 400 can be a piezoelectric MEMS acoustic transducer, such as a microphone, and each cantilevered beam 402 can include at least one piezoelectric layer disposed between two electrode layers. The piezoelectric layers can function to convert applied acoustic pressures into electrical signals (e.g., voltages), and the electrode layers can function to transmit the generated electrical signals to another component, such as an amplifier or an integrated circuit. In some examples, the piezoelectric layer(s) include aluminum nitride (AlN), lead zirconate titanate (PZT), zinc oxide (ZnO), polyvinylidene fluoride (PVDF), lead magnesium niobate-lead titanate (PMN-PT), or combinations of them, among other piezoelectric materials. The electrode layers can include molybdenum (Mo), titanium (Ti), aluminum (Al), or platinum (Pt), or combinations of them, among other suitable electrode materials. It should be noted that although the present discussion is in the context of a piezoelectric acoustic transducer, the techniques described here can be applied to any other suitable transducer that suffers from stressed cantilevers.

In general, each cantilevered beam 402 includes a fixed end 404a, sides 404b, 404c, and a free end 404d (e.g., a deflection end). At least a portion of the fixed end 404a can be coupled to a substrate 406, while the remaining portion of the cantilevered beam 402 (including the sides 404b, 404c and the free end 404d) can be substantially detached from the substrate 406. Preferably, each of the sides 404b, 404c of a given cantilevered beam 402 are parallel to a corresponding side 404b, 404c of an adjacent beam 402 and are separated by a gap 408. A size of the gap 408 can be set during manufacture and can be selected based on, for example, a desired acoustic resistance and/or low-frequency response for the transducer 400 (e.g., 85 Hz±15 Hz). In some examples, the gap 408 between adjacent cantilevered beams 402 is manufactured to be approximately 1 μm. After manufacture, the size of the gap 408 between adjacent cantilevered beams 402 is preferably maintained (e.g., at 1 μm), but may increase due to deformation of the beams 402 caused by residual stress. Additionally, manufacturing variance and differences in residual stress between different cantilevered beams and across beams in different devices can be tested to identify statistical characteristics associated with a design. Such variations can, for example, vary within a wafer, and across different wafers. Wafer level and device level testing can be used to determine if individual devices meet target performance characteristics (e.g., low frequency roll-off or −3 decibel (dB) frequency characteristics). For example, manufacturing and performance analysis of a design can test devices to determine the selected standard deviation value or another threshold tolerance to identify a threshold number or percentage of devices that will have vertical mismatch below a selected level. For example, testing can determine the six sigma (e.g., 99.99966%) vertical mismatch value where most MEMS acoustic transducers of a given design will have a vertical mismatch below the identified value after a given period of time. The threshold design value can be used to select a protrusion geometry that will limit performance degradation for MEMS acoustic transducers having a vertical deflection mismatch below the selected value. For example, if manufacturability and design testing identifies a six sigma vertical mismatch value of 15 micrometers (um), and that a minimum protrusion of 8 micrometers along the top edges along the gaps between the cantilevered beams in the design will limit the impact on airflow through the gap at the 15 um mismatch, the geometry of the cantilevered beams can be designed with such a protrusion. Other design considerations can include adjusting a thickness of a piezoelectric layer along with addition of the protrusion, placement of the electrodes to impact stiffness of the cantilevered beams, a width of the protrusion and whether the protrusion will cover an entire surface at a free (e.g., a top surface of a deflection) end of each cantilevered beam (e.g., impacting the mass of the beam and resonance frequencies in response to impinging acoustic waves), or other such design considerations. In some designs, a standard protrusion thickness and width at the beam surface (e.g., top, bottom, etc., to increase the thickness of the beam) can be used, with performance testing and adjustments made based on actual or simulated device performance. Such a standard thickness can, for example, be 30% of a thickness of the piezoelectric layer(s) of a cantilevered beam, with a minimum width of the protrusion geometry used based on the available manufacturing processes. In other examples, other thicknesses can be used (e.g., 40%, 15%, or fixed target thickness values for the protrusions for a given design.

In some examples, the free end 404d of each cantilevered beam 402 can have a substantially smaller width (e.g., an in-plane or X-Y plane width) than the width of the fixed end 404a, such that the beam 402 tapers from the fixed end 404a to the free end 404d. This arrangement can be achieved by each cantilevered beam 402 having a substantially triangular geometry, although other geometries (e.g., wedge-like geometries) can be used in some implementations. As noted above, this arrangement generally helps mitigate the effects of residual stress on the size of the gap 408, but may not be particularly effective at maintaining a desired gap 408 in the presence of variations in the residual stress across beams 402.

To prevent the size of the gap 408 between adjacent cantilevered beams 402 from increasing due to the effects of residual stress and/or vertical deflection mismatch, some or all of the beams 402 can include a protrusion 414 that increases a thickness 410 of at least a portion of the beam 402 adjacent to another beam. For example, the protrusion 414 can increase the thickness 410 of the beam 402 along at least a portion of the sides 404b, 404c or the free end 404d, or both. In some examples, the thickness 410 of the portion of the beam 402 can be increased such that is it greater than a thickness 412 of at least a portion of the fixed end 404a of the respective beam. The protrusion 414 can be produced by, for example, depositing material along the portion of the beam 402 adjacent to another beam, removing (e.g., etching) material from a portion of the beam 402, or combinations of such manufacturing processes.

In general, the arrangement and dimensions of the protrusion 414 can be selected based on the needs of the particular implementation. In this example, the protrusion 414 forms a wall along a top perimeter of the free end 404d and a portion of the sides 404b, 404c of the beam 402. In this way, the protrusion 414 maintains a consistent size of the gap 408 between adjacent beams 402 while limiting the added mass and limiting interference with a sensing area of the beam 402. In some examples, the thickness of the protrusion 414 is a target thickness (e.g., approximately 6 micrometers (μm), 4 μm, 8 μm, a thickness in a range between 2 μm and 15 μm, etc.), although a different thickness can be used depending on the expected deflection of the cantilevered beams 402. In some aspects, the thickness of the protrusion 414 can be set as a percentage of the thickness of the beam (e.g., the piezoelectric layer) such as 30%, 10%, etc. In some aspects, the thickness can be set based on testing of fabricated devices and the deflection mismatch, with the protrusion 414 thickness selected to limit the number of devices that do not meet performance targets due to deflection mismatch from residual stress. In general, the protrusion 414 can be formed using any suitable material, including metal, silicon nitride (Si3N4), silicon (Si), polysilicon, or combinations of Si3N4 and Si, among others.

FIGS. 4A-D illustrate aspects of one implementation of a MEMS acoustic transducer 400. The perspectives of FIGS. 4A-D illustrate adjacent cantilevered beams 402 separated by gap(s) 408. FIG. 4D illustrates details of each cantilevered beam 402, and FIG. 4A illustrates adjacent cantilevered beams 402A and 402B. The acoustic transducer 400 includes the substrate 406, a first cantilevered beam comprising a first piezoelectric structure 405 and a first protrusion 414 (e.g., the portion of the protrusion on a top surface of the first beam 402A). The piezoelectric structure has a first fixed end 403 and a first free end 404, where the first fixed end 403 is coupled to the substrate 406, and the first deflection end 404 is cantilevered away from the substrate 406. As described above in FIG. 1C, a piezoelectric structure can be a piezoelectric material with any number of electrode layers integrated with or coupled to the piezoelectric structure 105. FIGS. 4A-D, 5A-5D, 6A-6D, 7A-7D, and 8A-8D do not illustrate electrode layers, but such layers are present to allow transduction of acoustic pressure into an electrical signal.

The adjacent second cantilevered beam 402B similarly has a second protrusion 414 (e.g., the portion of the protrusion 414 on the top surface of the cantilevered beam 402B), and a second piezoelectric structure 405, where the second piezoelectric structure comprises a second deflection end 404 and a second fixed end 403, where the second fixed end is coupled to the substrate 406, and wherein the second deflection end 404 is cantilevered away from the substrate 406. As illustrated, the first cantilevered beam 402A is separated from the second cantilevered beam 402B by the gap 408, wherein the first protrusion 414 of the first cantilevered beam 402A is disposed at the first deflection end 404 (e.g., as illustrated by FIG. 4D) and increases a thickness 410 of the first cantilevered beam along the gap 408 at the first deflection end 404 (e.g., as compared to the thickness 412 at the fixed end 403). Similarly, the second protrusion 414 of the second cantilevered beam 402B is disposed at the second deflection end 404 and increases a thickness 410 of the second cantilevered beam 402B along the gap 408 at the second deflection end 404.

FIG. 4A is a top down view parallel to a plane of the piezoelectric layer, which is the layer including the piezoelectric structure 405. As described herein, the piezoelectric structures 405 of the cantilevered beams 402 are configured to deflect away from this plane (e.g., in and out of FIGS. 4A and 4B, and up and down in FIGS. 4C and 4D. An acoustic port 411 is part of an acoustic path that provides a path for acoustic pressure from outside the acoustic transducer 400 to the cantilevered beams 402. In FIGS. 4C and 4D, the protrusion 414 is shown as disposed on a top surface 413 of the piezoelectric structure 405. The illustrated protrusion 414 extends approximately half of a length from a tip of the fixed end 403 to a tip of the deflection (e.g., free) end 404. In other implementations, the protrusion extends less than one third of this length of the piezoelectric structure. In other aspects, the protrusion can be designed for a specific performance impact to limit mass added to the cantilevered beams 402 while increasing strength and limiting the impact of deflection mismatches as described herein.

The protrusion 414 of FIG. 4B illustrates a protrusion 414 placed on the top surface 413 within a threshold distance of the gap(s) 408 on either side of the cantilevered beams. Other protrusion placements are described below in FIGS. 5A-5D, 6A-6D, 7A-7D, and 8A-8D. As can be seen from FIG. 4A, the combination of the cantilevered beams 402 and the gaps 408 between the cantilevered beams 402 enclose a symmetrical polygonal shape (e.g., an octagon).

FIGS. 5A-5D, 6A-6D, 7A-7D, and 8A-8D illustrate various embodiments of acoustic transducers in accordance with an aspect of the present disclosure. Each of these acoustic transducers are substantially similar to the acoustic transducer 400 described with reference to FIGS. 4A-4D, and for the sake of brevity only the differences will be described. Referring to FIGS. 5A-5D, an acoustic transducer 500 includes a plurality of cantilevered beams 502 each having a protrusion 514 arranged to form a wall along a bottom perimeter of the free end 404d and a portion of the sides 404b, 404c of the beam 502 (e.g., the protrusion 514 is arranged on a plane that intersects with a plane defined by the underlying substrate 406). In FIGS. 5A-5D, the protrusion 514 is disposed on a bottom surface 513 of the piezoelectric structure 405. In some examples, the protrusion 514 can be produced through etching of the underlying substrate 406, rather than depositing an additional layer on top of the cantilevered beam 502 (as in FIGS. 4A-4D), and thus can reduce the cost of manufacturing the transducer 500. Referring to FIGS. 6A-6D, an acoustic transducer 600 includes a plurality of cantilevered beams 602 each having a protrusion 614 formed within the beam 602 and producing a wall along a top perimeter of the free end 404d and a portion of the sides 404b, 404c of the beam. Referring to FIGS. 7A-7D, an acoustic transducer 700 includes a plurality of cantilevered beams 702 each having a protrusion 714 that is similar to the protrusion 614 of the beams 602 with the addition of a connecting member 716 to, for example, improve the strength of the protrusion 714. Referring to FIGS. 8A-8D, an acoustic transducer 800 includes a plurality of cantilevered beams 802 each having a protrusion 814 that is similar to the protrusion 714 of the beams 702, but is completely filled to form a solid mass rather than a wall. In some examples, the protrusion 814 can be easier to manufacture than, for example, the protrusion 714, but the greater overall mass of the protrusion 814 can reduce the resonant frequency of the beam 802 (and, thus, the transducer 800).

Each of FIGS. 4A-4D, 5A-5D, 6A-6D, 7A-7D, and 8A-8D illustrate aspects of MEMS acoustic transducers as described herein. while the illustrated aspects specifically described herein include cantilevered beams in MEMS transducers where each cantilevered beam has the same pattern of protrusion on each cantilevered beam, in some aspects, adjacent beams can include different protrusions patterns, or adjacent cantilevered beams may include one beam with a protrusion and another without a protrusion.

Figure 9:
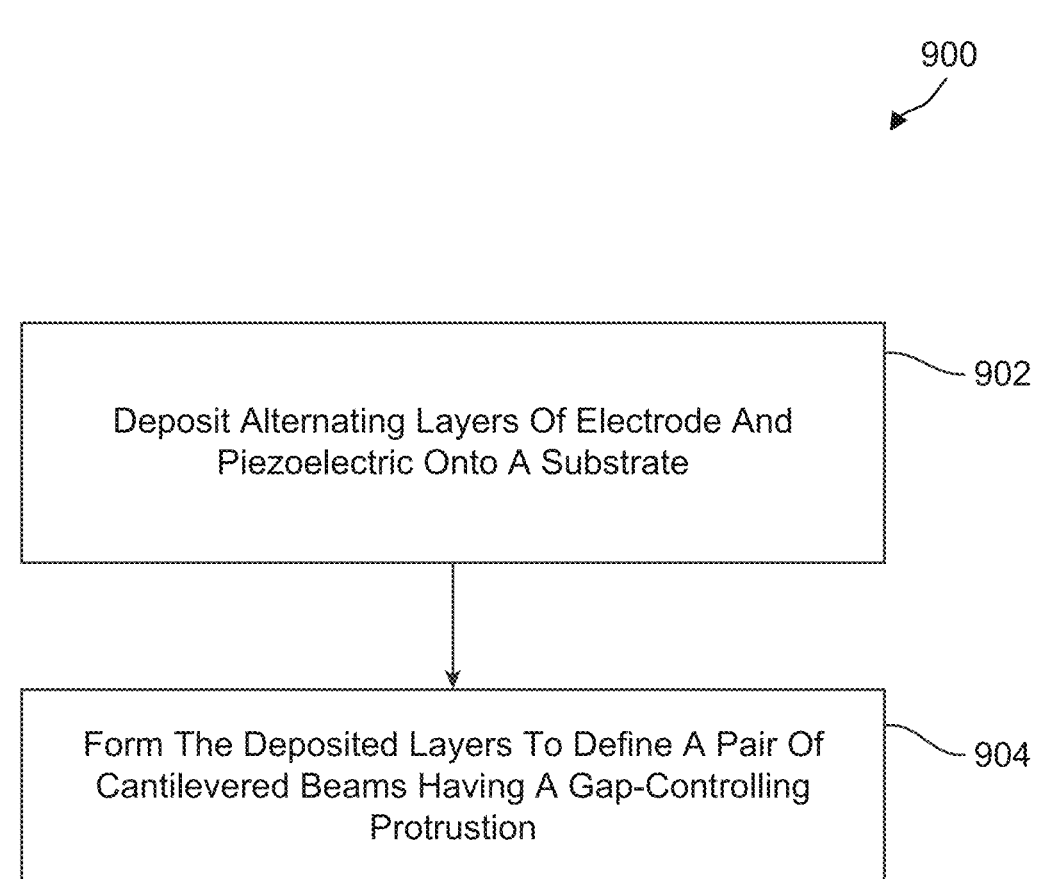
FIG. 9 illustrates an example process for manufacturing an acoustic transducer in accordance with aspects described herein.

FIG. 9 illustrates an exemplary process 900 for manufacturing an acoustic transducer in accordance with an aspect of the present disclosure. At 902, alternating layers of electrode and piezoelectric are deposited onto a substrate. In certain aspects, a first electrode layer is deposited on a substrate (or onto a SiO2 layer on the substrate). A first piezoelectric layer can be deposited on the first electrode layer. A second electrode layer can be deposited on the first piezoelectric layer. As such, alternating layers of electrode and piezoelectric are deposited onto a substrate. In some examples, multiple alternating layers of electrode and piezoelectric material are deposited onto the substrate. For example, a second piezoelectric layer can be deposited on the second electrode layer. Further, a third electrode layer can be deposited on the second piezoelectric layer. Thus, there may be one or more electrode-piezoelectric-electrode compositions.

At 904, the deposited layers formed to define one or more cantilevered beams having a gap-controlling protrusion dimensioned to increase the thickness of the beam along at least a portion of the beam that is adjacent to another beam. In some examples, the deposited layers are formed using an etching process. In other examples, other methods of formation can be used. In some examples, the deposited layers are formed to define at least a first cantilevered beam and a second cantilevered beam that is adjacent to the first beam. Each cantilevered beam can include a piezoelectric layer disposed between a pair of electrode layers. Further, each cantilevered beam can include a base attached to the substrate, a body and sides free from the substrate, and an end free from the substrate. In some examples, the free end of each cantilevered beam can have a substantially smaller width (e.g., an in-plane or X-Y plane width) than the width of the fixed end, such that the beam tapers from the fixed end to the free end.

In some aspects, a protrusion is formed along at least a portion of each of the first and second beams that is adjacent to the other beam. For example, the protrusion can be formed along at least a portion of the body/sides of the beam, the free end of the beam, or both. In some aspects, the protrusion is placed less than a threshold distance from an edge of the beam near the gap. In some aspects, a protrusion can be formed in a material layer, with a central portion of the protrusion etched out to reduce a mass of the protrusion, creating an outline shape around a deflection end of a beam, with the outline shape positioned along the gap edges and through a central portion of the beam (e.g., similar to the protrusion 714 of FIGS. 7A-D). In some aspects, the protrusion can be dimensioned to increase the thickness of the beam along the at least the portion of the beam. In some aspects, the thickness of the portion of the beam can be increased such that it is greater than a thickness of at least a portion of the fixed end of the respective beam. The protrusion can be built out of material above or below the first and second cantilevered beams. In some aspects, the protrusion can be located at a position associated with a vertical deflection mismatch between the first and second cantilevered beams. In some aspects, a size of the gap between the first and second cantilevered beams is reduced to (or maintained at) a size of the manufactured gap between the beams as a result of the protrusion. As such, the gap between the first and second cantilevered beams can decrease in size relative to a size of the gap between the first and second cantilevered beams independent of the protrusion.

FIG. 10. illustrates a method 1000 associated with MEMS acoustic transducers in accordance with aspects described herein. In some aspects, the method is performed as part of a system configured for fabrication of MEMS acoustic transducers (e.g., the acoustic transducer 100, 400, 500, 600, 700, 800, etc.) In some aspects, the method 1000 is implemented as computer readable instructions in a storage medium.

The method 1000 includes block 1002. The block 1002 describes operations for fabricating a first piezoelectric structure of a first cantilevered beam and a second piezoelectric structure of a second cantilevered beam using a piezoelectric layer on a substrate.

The method 1000 includes block 1004. The block 1004 describes operations for fabricating a first protrusion on the first piezoelectric structure and a second protrusion on the second piezoelectric structure. Some such methods include the block 1004 where the first cantilevered beam comprises the first protrusion and the first piezoelectric structure in the piezoelectric layer, wherein the first piezoelectric structure comprises a first deflection end and a first fixed end, wherein the first fixed end is coupled to the substrate, wherein the first deflection end is cantilevered away from the substrate. Some such methods include the block 1004 where the second cantilevered beam comprises the second protrusion and the second piezoelectric structure in the piezoelectric layer, wherein the second piezoelectric structure comprises a second deflection end and a second fixed end, wherein the second fixed end is coupled to the substrate, wherein the second deflection end is cantilevered away from the substrate. Some such methods include the block 1004 where the first cantilevered beam is separated from the second cantilevered beam by a gap. Some such methods include the block 1004 where the first protrusion is disposed at the first deflection end and increases a thickness of the first cantilevered beam along the gap at the first deflection end. Some such methods include the block 1004 where the second protrusion is disposed at the second deflection end and increases a thickness of the second cantilevered beam along the gap at the second deflection end.

Additional aspects can include methods with operations for fabricating a device with any structure described herein.

Figure 11:
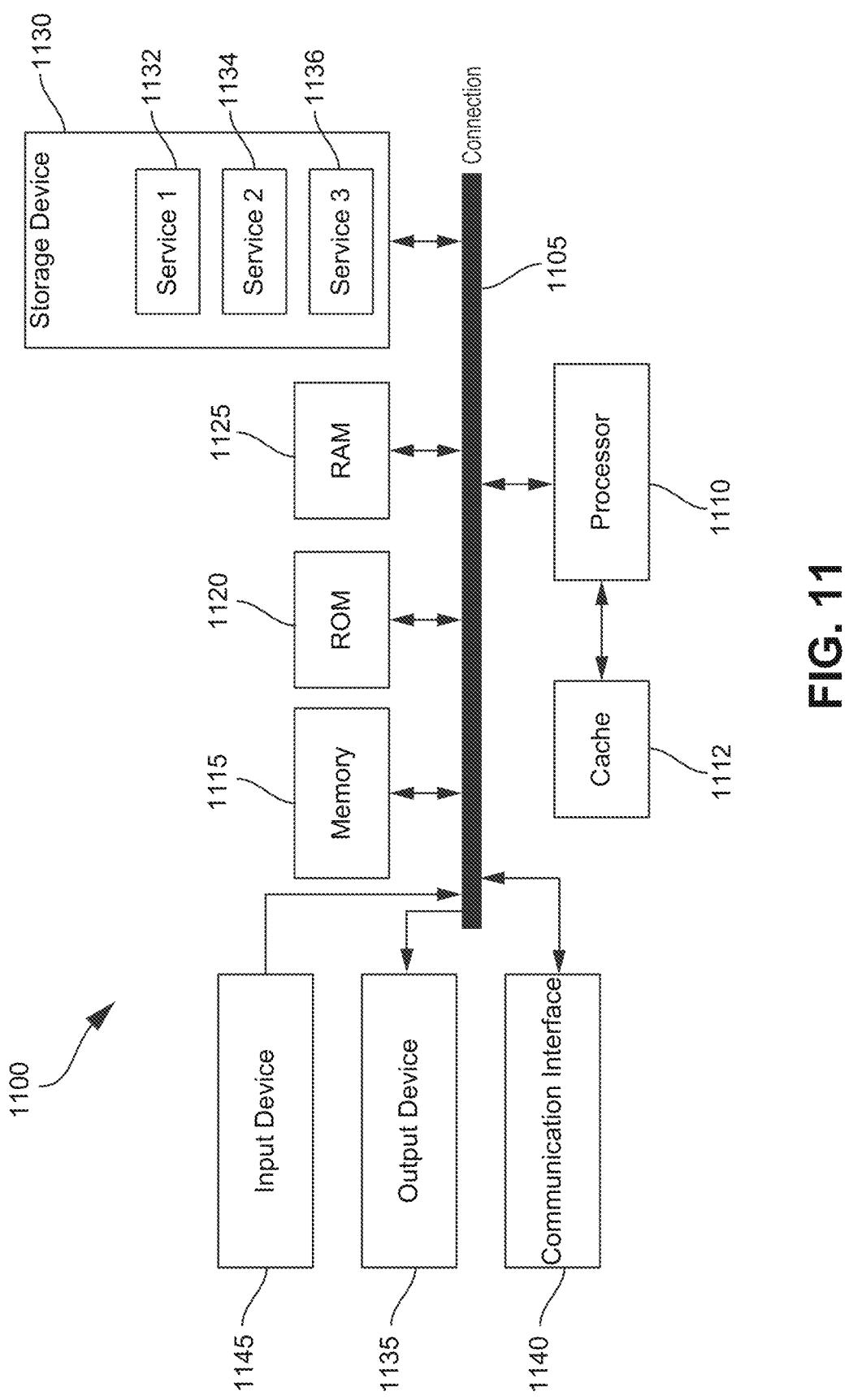
FIG. 11. illustrates a computing device integrated with a MEMS acoustic transducer in accordance with aspects described herein.

FIG. 11 is a diagram illustrating an example of a system for implementing certain aspects of the present technology. In particular, FIG. 11 illustrates an example of computing system 1100 which can include an acoustic transducer (e.g., a MEMS microphone) in accordance with aspects described herein. The acoustic transducer (e.g., the MEMS transducer 11, the acoustic transducer 400, etc.) can be integrated, for example, with any computing device making up internal computing system, a remote computing system, a camera, or any component thereof in which the components of the system are in communication with each other using connection 1105. Connection 1105 may be a physical connection using a bus, or a direct connection into processor 1110, such as in a chipset architecture. Connection 1105 may also be a virtual connection, networked connection, or logical connection.

In some embodiments, computing system 1100 is a distributed system in which the functions described in this disclosure may be distributed within a datacenter, multiple data centers, a peer network, etc. In some embodiments, one or more of the described system components represents many such components each performing some or all of the function for which the component is described. In some embodiments, the components may be physical or virtual devices.

Example system 1100 includes at least one processing unit (CPU or processor) 1110 and connection 1105 that communicatively couples various system components including system memory 1115, such as read-only memory (ROM) 1120 and random access memory (RAM) 1125 to processor 1110. Computing system 1100 may include a cache 1112 of high-speed memory connected directly with, in close proximity to, or integrated as part of processor 1110.

Processor 1110 may include any general purpose processor and a hardware service or software service, such as services 1132, 1134, and 1136 stored in storage device 1130, configured to control processor 1110 as well as a special-purpose processor where software instructions are incorporated into the actual processor design. Processor 1110 may essentially be a completely self-contained computing system, containing multiple cores or processors, a bus, memory controller, cache, etc. A multi-core processor may be symmetric or asymmetric.

To enable user interaction, computing system 1100 includes an input device 1145, which may represent any number of input mechanisms, such as a microphone for speech or audio detection (e.g., the MEMS transducer 11, the acoustic transducer 400, etc.) along with other input devices 1145 such as a touch-sensitive screen for gesture or graphical input, keyboard, mouse, motion input, speech, etc.

Computing system 1100 may also include output device 1135, which may be one or more of a number of output mechanisms. In some instances, multimodal systems may enable a user to provide multiple types of input/output to communicate with computing system 1100.

Computing system 1100 may include communications interface 1140, which may generally govern and manage the user input and system output. The communication interface may perform or facilitate receipt and/or transmission wired or wireless communications using wired and/or wireless transceivers, including those making use of an audio jack/plug, a microphone jack/plug, a universal serial bus (USB) port/plug, an Apple™ Lightning™ port/plug, an Ethernet port/plug, a fiber optic port/plug, a proprietary wired port/plug, 3G, 4G, 5G and/or other cellular data network wireless signal transfer, a Bluetooth™ wireless signal transfer, a Bluetooth™ low energy (BLE) wireless signal transfer, an IBEACON™ wireless signal transfer, a radio-frequency identification (RFID) wireless signal transfer, near-field communications (NFC) wireless signal transfer, dedicated short range communication (DSRC) wireless signal transfer, 802.11 Wi-Fi wireless signal transfer, wireless local area network (WLAN) signal transfer, Visible Light Communication (VLC), Worldwide Interoperability for Microwave Access (WiMAX), Infrared (IR) communication wireless signal transfer, Public Switched Telephone Network (PSTN) signal transfer, Integrated Services Digital Network (ISDN) signal transfer, ad-hoc network signal transfer, radio wave signal transfer, microwave signal transfer, infrared signal transfer, visible light signal transfer, ultraviolet light signal transfer, wireless signal transfer along the electromagnetic spectrum, or some combination thereof. The communications interface 1140 may also include one or more Global Navigation Satellite System (GNSS) receivers or transceivers that are used to determine a location of the computing system 1100 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 1130 may be a non-volatile and/or non-transitory and/or computer-readable memory device and may be a hard disk or other types of computer readable media which may store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a compact disc read only memory (CD-ROM) optical disc, a rewritable compact disc (CD) optical disc, digital video disk (DVD) optical disc, a blu-ray disc (BDD) optical disc, a holographic optical disk, another optical medium, a secure digital (SD) card, a micro secure digital (microSD) card, a Memory Stick® card, a smartcard chip, a EMV chip, a subscriber identity module (SIM) card, a mini/micro/nano/pico SIM card, another integrated circuit (IC) chip/card, random access memory (RAM), static RAM (SRAM), dynamic RAM (DRAM), read-only memory (ROM), programmable read-only memory (PROM), erasable programmable read-only memory (EPROM), electrically erasable programmable read-only memory (EE-PROM), flash EPROM (FLASHEPROM), cache memory (e.g., Level 1 (L1) cache, Level 2 (L2) cache, Level 3 (L3) cache, Level 4 (L4) cache, Level 5 (L5) cache, or other (L#) cache), resistive random-access memory (RRAM/ReRAM), phase change memory (PCM), spin transfer torque RAM (STT-RAM), another memory chip or cartridge, and/or a combination thereof.

The storage device 1130 may include software services, servers, services, etc., that when the code that defines such software is executed by the processor 1110, it causes the system to perform a function. In some embodiments, a hardware service that performs a particular function may include the software component stored in a computer-readable medium in connection with the necessary hardware components, such as processor 1110, connection 1105, output device 1135, etc., to carry out the function. The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data may be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Specific details are provided in the description above to provide a thorough understanding of the embodiments and examples provided herein, but those skilled in the art will recognize that the application is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described application may be used individually or jointly. Further, embodiments may be utilized in any number of environments and applications beyond those described herein without departing from the broader scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

For clarity of explanation, in some instances the present technology may be presented as including individual functional blocks including devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Individual embodiments may be described above as a process or method which is depicted as a flowchart, a flow diagram, a data flow diagram, a structure diagram, or a block diagram. Although a flowchart may describe the operations as a sequential process, many of the operations may be performed in parallel or concurrently. In addition, the order of the operations may be rearranged. A process is terminated when its operations are completed but could have additional steps not included in a figure. A process may correspond to a method, a function, a procedure, a subroutine, a subprogram, etc. When a process corresponds to a function, its termination may correspond to a return of the function to the calling function or the main function.

Processes and methods according to the above-described examples may be implemented using computer-executable instructions that are stored or otherwise available from computer-readable media. Such instructions may include, for example, instructions and data which cause or otherwise configure a general purpose computer, special purpose computer, or a processing device to perform a certain function or group of functions. Portions of computer resources used may be accessible over a network. The computer executable instructions may be, for example, binaries, intermediate format instructions such as assembly language, firmware, source code. Examples of computer-readable media that may be used to store instructions, information used, and/or information created during methods according to described examples include magnetic or optical disks, flash memory, USB devices provided with non-volatile memory, networked storage devices, and so on.

In some embodiments the computer-readable storage devices, mediums, and memories may include a cable or wireless signal containing a bitstream and the like. However, when mentioned, non-transitory computer-readable storage media expressly exclude media such as energy, carrier signals, electromagnetic waves, and signals per se.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof, in some cases depending in part on the particular application, in part on the desired design, in part on the corresponding technology, etc.

The various illustrative logical blocks, modules, and circuits described in connection with the aspects disclosed herein may be implemented or performed using hardware, software, firmware, middleware, microcode, hardware description languages, or any combination thereof, and may take any of a variety of form factors. When implemented in software, firmware, middleware, or microcode, the program code or code segments to perform the necessary tasks (e.g., a computer-program product) may be stored in a computer-readable or machine-readable medium. A processor(s) may perform the necessary tasks. Examples of form factors include laptops, smart phones, mobile phones, tablet devices or other small form factor personal computers, personal digital assistants, rackmount devices, standalone devices, and so on. Functionality described herein also may be embodied in peripherals or add-in cards. Such functionality may also be implemented on a circuit board among different chips or different processes executing in a single device, by way of further example.

The instructions, media for conveying such instructions, computing resources for executing them, and other structures for supporting such computing resources are example means for providing the functions described in the disclosure.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium including program code including instructions that, when executed, performs one or more of the methods, algorithms, and/or operations described above. The computer-readable data storage medium may form part of a computer program product, which may include packaging materials. The computer-readable medium may include memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that may be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general-purpose processor may be a microprocessor; but in the alternative, the processor may be any conventional processor, controller, micro-controller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein.

Where components are described as being "configured to" perform certain operations, such configuration may be accomplished, for example, by designing electronic circuits or other hardware to perform the operation, by programming programmable electronic circuits (e.g., microprocessors, or other suitable electronic circuits) to perform the operation, or any combination thereof.

The phrase "coupled to" or "communicatively coupled to" refers to any component that is physically connected to another component either directly or indirectly, and/or any component that is in communication with another component (e.g., connected to the other component over a wired or wireless connection, and/or other suitable communication interface) either directly or indirectly.

A number of implementations have been described. Nevertheless, it will be understood that various modifications may be made without departing from the spirit and scope of the disclosure. Other embodiments are within the scope of the claims.

Illustrative aspects of the disclosure include:

Aspect 1. A microelectromechanical (MEMS) transducer, comprising: a substrate; a first cantilevered beam comprising a first protrusion and a first piezoelectric structure, wherein the first piezoelectric structure comprises a first deflection end and a first fixed end, wherein the first fixed end is coupled to the substrate, and wherein the first deflection end is cantilevered away from the substrate; a second cantilevered beam comprising a second protrusion and a second piezoelectric structure, wherein the second piezoelectric structure comprises a second deflection end and a second fixed end, wherein the second fixed end is coupled to the substrate, and wherein the second deflection end is cantilevered away from the substrate; wherein the first cantilevered beam is separated from the second cantilevered beam by a gap; wherein the first protrusion is disposed at the first deflection end and increases a thickness of the first cantilevered beam along the gap at the first deflection end; and wherein the second protrusion is disposed at the second deflection end and increases a thickness of the second cantilevered beam along the gap at the second deflection end.

Aspect 2. The MEMS transducer of Aspect 1, wherein: the first piezoelectric structure is disposed in a plane of a piezoelectric layer and configured to deflect away from the plane of the piezoelectric layer at the first deflection end in response to acoustic vibrations on the first cantilevered beam; and the second piezoelectric structure is disposed in the plane of the piezoelectric layer and configured to deflect away from the plane of the piezoelectric layer at the second deflection end in response to the acoustic vibrations on the second cantilevered beam.

Aspect 3. The MEMS transducer of any of Aspects 1 to 2, further comprising an acoustic port configured to provide an acoustic path from outside the MEMS transducer to the first cantilevered beam and the second cantilevered beam.

Aspect 4. The MEMS transducer of Aspect 3, wherein the first protrusion is disposed on a top surface of the first piezoelectric structure parallel to a plane of a piezoelectric layer on an opposite side of the plane of the piezoelectric layer from the acoustic port.

Aspect 5. The MEMS transducer of Aspect 4, wherein the first protrusion extends less than one third of a distance from the first deflection end toward the substrate.

Aspect 6. The MEMS transducer of any of Aspects 1 to 5, wherein the first protrusion is disposed on a bottom surface of the first piezoelectric structure parallel to a plane of a piezoelectric layer on a same side of the plane as the acoustic port, and wherein the first piezoelectric structure is fabricated in the plane of the piezoelectric layer.

Aspect 7. The MEMS transducer of any of Aspects 1 to 5, wherein the first protrusion covers a surface of the first piezoelectric structure at the first deflection end of the first piezoelectric structure.

Aspect 8. The MEMS transducer of any of Aspects 1 to 5, wherein the first protrusion covers an outline of a surface of the first piezoelectric structure at the first deflection end of the first piezoelectric structure.

Aspect 9. The MEMS transducer of Aspect 8, wherein the first cantilevered beam further comprises: a first electrode layer disposed on a top surface of the first fixed end of the first piezoelectric structure; and a second electrode layer disposed on a bottom surface of the first fixed end of the first piezoelectric structure, wherein the bottom surface is parallel to the top surface of the first fixed end of the first piezoelectric structure on an opposite side of the first piezoelectric structure.

Aspect 10. The MEMS transducer of any of Aspects 3 to 9, wherein the first electrode layer and the second electrode layer extends less than two-thirds of a distance from the first fixed end toward the first deflection end.

Aspect 11. The MEMS transducer of any of Aspects 1 to 10, further comprising: a third cantilevered beam comprising a third protrusion and a third piezoelectric structure, wherein the third piezoelectric structure comprises a third deflection end and a third fixed end, wherein the third fixed end is coupled to the substrate, wherein the third deflection end is cantilevered away from the substrate; wherein the gap has an initial gap distance between the first fixed end and the second fixed end, and wherein the gap has a gap distance that varies based on a length along the gap away from the substrate; wherein the first cantilevered beam is separated from the third cantilevered beam by a second gap, wherein the second gap has the initial gap distance between the first fixed end and the third fixed end, and wherein the second gap has a second gap distance that varies based on a second length along the second gap away from the substrate, a deflection position of the first cantilevered beam, and a deflection position of the third cantilevered beam; and wherein the first protrusion further increases the thickness of the first cantilevered beam along the second gap at the first deflection end.

Aspect 12. The MEMS transducer of Aspect 11, wherein the first protrusion is disposed on a top surface of the first piezoelectric structure at positions less than a threshold distance from the gap or the second gap.

Aspect 13. The MEMS transducer of any of Aspects 1 to 12, further comprising a plurality of cantilevered beams, each comprising a corresponding protrusion and a corresponding piezoelectric structure, wherein each corresponding piezoelectric structure comprises a corresponding deflection end and a corresponding fixed end, wherein each of the plurality of cantilevered beams is separated from a first adjacent cantilevered beam by a first corresponding gap and a second adjacent cantilevered beam by a second corresponding gap.

Aspect 14. The MEMS transducer of Aspect 13 wherein the plurality of cantilevered beams and associated gaps between the plurality of cantilevered beams enclose a symmetrical polygonal shape.

Aspect 15. The MEMS transducer of Aspect 14, wherein each corresponding piezoelectric structure has a same triangular shape in a shared piezoelectric layer.

Aspect 16. The MEMS transducer of Aspect 14, further comprising an acoustic port that provides an acoustic path for sound from outside the MEMS transducer to travel to the plurality of cantilevered beams.

Aspect 17. The MEMS transducer of Aspect 16, further comprising a pocket on an opposite side of the plurality of cantilevered beams from the acoustic port, wherein a pressure differential between a pressure of the pocket and a pressure of the acoustic port causes deflections of the plurality of cantilevered beams and an associated generation of electrical signals.

Aspect 18. The MEMS transducer of any of Aspects 1 to 17, wherein the gap has an initial gap distance between the first fixed end and the second fixed end, and wherein the gap has a gap distance that varies based on a length along the gap away from a top surface of the substrate; wherein the initial gap distance is approximately one micrometer (um), and wherein the gap distance at a tip of the first deflection end is approximately 15 um.

Aspect 19. The MEMS transducer of any of Aspects 1 to 18, wherein a thickness of the first protrusion and a thickness of the second protrusion is based on a variation in deflection mismatches between positions of the first deflection end and the second deflection end determined from manufacturing variations and material stress of a MEMS transducer design for the MEMS transducer.

Aspect 20. The MEMS transducer of any of Aspects 1 to 19, wherein the first cantilevered beam and the second cantilevered beam each comprise electrode layers, the MEMS transducer further comprising control circuitry coupled to the electrode layers and configured to process acoustic signal from acoustic deflections in the first cantilevered beam and the second cantilevered beam.

Aspect 21. A method comprising: fabricating a first piezoelectric structure of a first cantilevered beam and a second piezoelectric structure of a second cantilevered beam using a piezoelectric layer on a substrate; and fabricating a first protrusion on the first piezoelectric structure and a second protrusion on the second piezoelectric structure; wherein the first cantilevered beam comprises the first protrusion and the first piezoelectric structure in the piezoelectric layer, wherein the first piezoelectric structure comprises a first deflection end and a first fixed end, wherein the first fixed end is coupled to the substrate, wherein the first deflection end is cantilevered away from the substrate; wherein the second cantilevered beam comprises the second protrusion and the second piezoelectric structure in the piezoelectric layer, wherein the second piezoelectric structure comprises a second deflection end and a second fixed end, wherein the second fixed end is coupled to the substrate, wherein the second deflection end is cantilevered away from the substrate; wherein the first cantilevered beam is separated from the second cantilevered beam by a gap; wherein the first protrusion is disposed at the first deflection end and increases a thickness of the first cantilevered beam along the gap at the first deflection end; and wherein the second protrusion is disposed at the second deflection end and increases a thickness of the second cantilevered beam along the gap at the second deflection end.

Aspect 22. The method of Aspect 21, wherein: the first piezoelectric structure is disposed in a plane of the piezoelectric layer and configured to deflect away from the plane of the piezoelectric layer at the first deflection end in response to acoustic vibrations on the first cantilevered beam; and the second piezoelectric structure is disposed in the plane of the piezoelectric layer and configured to deflect away from the plane of the piezoelectric layer at the second deflection end in response to the acoustic vibrations on the second cantilevered beam.

Aspect 23. The method of any of Aspects 21 to 22, further comprising fabricating an acoustic port configured to provide an acoustic path from an acoustic source to the first cantilevered beam and the second cantilevered beam, wherein the first protrusion is disposed on a top surface of the first piezoelectric structure parallel to a plane of the piezoelectric layer on an opposite side of the plane of the piezoelectric layer from the acoustic port, and wherein the first protrusion extends less than one third of a distance from the first deflection end toward the substrate.

Aspect 24. The method of any of Aspects 21 to 23, further comprising: fabricating a third cantilevered beam comprising a third protrusion and a third piezoelectric structure, wherein the third piezoelectric structure comprises a third deflection end and a third fixed end, wherein the third fixed end is coupled to a top surface of the substrate, wherein the third deflection end is cantilevered away from the substrate, wherein the gap has an initial gap distance between the first fixed end and the second fixed end, and wherein the gap has a gap distance that varies based on a length along the gap away from the top surface, wherein the first cantilevered beam is separated from the third cantilevered beam by a second gap, wherein the second gap has the initial gap distance between the first fixed end and the third fixed end, and wherein the second gap has a second gap distance that varies based on a second length along the second gap away from the top surface, a deflection position of the first cantilevered beam, and a deflection position of the third cantilevered beam, and wherein the first protrusion further increases the thickness of the first cantilevered beam along the second gap at the first deflection end.

Aspect 25. The method of any of Aspects 21 to 24, further comprising fabricating a plurality of cantilevered beams, each comprising a corresponding protrusion and a corresponding piezoelectric structure, wherein each corresponding piezoelectric structure comprises a corresponding deflection end and a corresponding fixed end, wherein each of the plurality of cantilevered beams is separated from a first adjacent cantilevered beam by a first corresponding gap and a second adjacent cantilevered beam by a second corresponding gap.

Aspect 26. The method of any of Aspects 21 to 25, wherein the plurality of cantilevered beams and associated gaps between the plurality of cantilevered beams enclose a symmetrical polygonal shape, wherein each corresponding piezoelectric structure has a same triangular shape in a shared piezoelectric layer.

Aspect 27. The method of any of Aspects 21 to 26, further comprising fabricating a package comprising an acoustic port that provides an acoustic path for sound from an outside acoustic source to travel to the plurality of cantilevered beams.

Aspect 28. A microelectromechanical (MEMS) transducer, comprising: a substrate; a first cantilevered beam comprising a first protrusion and a first piezoelectric structure, wherein the first piezoelectric structure comprises a top surface, a bottom surface, a first side, a first end coupled to the substrate, and a second end cantilevered away from the substrate and the first end; and a second cantilevered beam comprising a second protrusion and a second piezoelectric structure, wherein the second piezoelectric structure comprises a top surface, a bottom surface, a first side, a first end coupled to the substrate and a second end cantilevered away from the substrate and the first end; wherein the first cantilevered beam is positioned adjacent to the second cantilevered beam separated by a gap between the first side of the first piezoelectric structure and the first side of the second piezoelectric structure, with a corner of the first end of the first cantilevered beam coupled to the substrate separated from a corner of the first end of the second cantilevered beam coupled to the substrate by an initial gap distance, wherein the first side of the first piezoelectric structure and the first side of the second piezoelectric structure are separated by a gap distance; wherein the first protrusion is positioned on the top surface or the bottom surface of the first piezoelectric structure at the second end of the first piezoelectric structure along a top first side edge of the first cantilevered beam along the gap; and wherein the second protrusion is positioned on the top surface or the bottom surface at the second end of the second piezoelectric structure along a top first side edge of the second cantilevered beam along the gap.

Aspect 29. The MEMS transducer of Aspect 28, further comprising: a third cantilevered beam comprising a third protrusion and a third piezoelectric structure, wherein the third piezoelectric structure comprises a third deflection end and a third fixed end, wherein the third fixed end is coupled to the substrate, wherein the third deflection end is cantilevered away from the substrate, wherein the gap has a gap distance that varies based on a length along the gap away from the top surface, wherein the first cantilevered beam is separated from the third cantilevered beam by a second gap, wherein the second gap has the initial gap distance between the first fixed end and the third fixed end, and wherein the second gap has a second gap distance that varies based on a second length along the second gap away from the top surface, a deflection position of the first cantilevered beam, and a deflection position of the third cantilevered beam, and wherein the first protrusion further increases a thickness of the first cantilevered beam along the second gap at the first deflection end.

Aspect 30. The MEMS transducer of any of Aspects 28 to 29, further comprising a plurality of cantilevered beams, each comprising a corresponding protrusion and a corresponding piezoelectric structure, wherein each corresponding piezoelectric structure comprises a corresponding deflection end and a corresponding fixed end, wherein each of the plurality of cantilevered beams is separated from a first adjacent cantilevered beam by a first corresponding gap and a second adjacent cantilevered beam by a second corresponding gap, wherein the plurality of cantilevered beams and associated gaps between the plurality of cantilevered beams enclose a symmetrical polygonal shape, wherein each corresponding piezoelectric structure has a same triangular shape in a shared piezoelectric layer.

Aspect 31. The MEMS transducer of Aspect 28, further comprising a third cantilevered beam comprising a third protrusion and a third piezoelectric structure; wherein the third piezoelectric structure comprises a top surface, a bottom surface, a first side, a first end coupled to the substrate, and a second end cantilevered away from the substrate and the first end; wherein the second end of the third cantilevered beam is cantilevered away from the substrate and configured to deflect out of a piezoelectric layer plane in response to acoustic pressure; wherein the first cantilevered beam is positioned adjacent to the third cantilevered beam separated by a gap between a second side of the first piezoelectric structure and the first side of the third piezoelectric structure, with a second corner of the first end of the first cantilevered beam coupled to the substrate separated from a corner of a first end of the third cantilevered beam coupled to the substrate by a second gap distance.

Aspect 30. The MEMS transducer of Aspect 28, further comprising a plurality of cantilevered beams, each comprising a corresponding protrusion and a corresponding piezoelectric structure, wherein each corresponding piezoelectric structure comprises a corresponding second end cantilevered away from the substrate and a corresponding first end attached to the substrate, wherein each of the plurality of cantilevered beams is separated from a first adjacent cantilevered beam by a first corresponding gap and a second adjacent cantilevered beam by a second corresponding gap, wherein the plurality of cantilevered beams and associated gaps between the plurality of cantilevered beams enclose a symmetrical polygonal shape, wherein each corresponding piezoelectric structure has a same triangular shape in a shared piezoelectric layer.

Aspect 31. A microelectromechanical (MEMS) transducer, comprising: a substrate with a top portion; a first cantilevered beam comprising one or more first portions and a first protrusion, with the one or more first portions extending at a first vertical deflection relative to a plane of the top portion of the substrate; a second cantilevered beam comprising one or more second portions and a second protrusion, with the one or more second portions extending at a second vertical deflection relative to the plane of the top portion of the substrate; a gap between the first cantilevered beam and the second cantilevered beam, with a size of the gap varying based on a vertical deflection mismatch between the first cantilevered beam and the second cantilevered beam, wherein the first protrusion is positioned as part of a structure of the first cantilevered beam along a portion of the gap to increase a thickness of the first cantilevered beam along; and a protrusion attached to the first cantilevered beam or the second cantilevered beam, the protrusion dimensioned to decrease a size of the gap, relative to a size of the gap independent of the protrusion.

Aspect 32. further comprising a plurality of cantilevered beams, each comprising a corresponding protrusion and a corresponding piezoelectric structure, wherein each corresponding piezoelectric structure comprises a corresponding second end cantilevered away from the substrate and a corresponding first end attached to the substrate, wherein each of the plurality of cantilevered beams is separated from a first adjacent cantilevered beam by a first corresponding gap and a second adjacent cantilevered beam by a second corresponding gap, wherein the plurality of cantilevered beams and associated gaps between the plurality of cantilevered beams enclose a symmetrical polygonal shape, wherein each corresponding piezoelectric structure has a same triangular shape in a shared piezoelectric layer.

Aspect 33. A microelectromechanical (MEMS) transducer, comprising means for providing an improved low-frequency response in accordance with any aspect described herein.

Aspect 34. A method for fabricating any MEMS transducer described herein.

Aspect 35. A storage medium comprising instructions that, when executed by a system, causes the system to perform any operations described herein.

What is claimed is:

1. A microelectromechanical (MEMS) transducer, comprising:
   a substrate;
   a first cantilevered beam comprising a first protrusion and a first piezoelectric structure, wherein the first piezoelectric structure comprises a first deflection end and a first fixed end, wherein the first fixed end is coupled to the substrate, and wherein the first deflection end is cantilevered away from the substrate; and
   a second cantilevered beam comprising a second protrusion and a second piezoelectric structure, wherein the second piezoelectric structure comprises a second deflection end and a second fixed end, wherein the second fixed end is coupled to the substrate, and wherein the second deflection end is cantilevered away from the substrate;
   wherein the first cantilevered beam is separated from the second cantilevered beam by a gap;
   wherein the first protrusion is disposed at the first deflection end and increases a thickness of the first cantilevered beam along the gap at the first deflection end;
   wherein the second protrusion is disposed at the second deflection end and increases a thickness of the second cantilevered beam along the gap at the second deflection end,
   wherein the first protrusion covers an outline of a surface of the first piezoelectric structure at the first deflection end of the first piezoelectric structure, and
   wherein the first protrusion and the second protrusion comprise an inorganic thin-film material to add rigidity.

2. The MEMS transducer of claim 1, wherein:
   the first piezoelectric structure is disposed in a plane of a piezoelectric layer and configured to deflect away from the plane of the piezoelectric layer at the first deflection end in response to acoustic vibrations on the first cantilevered beam; and
   the second piezoelectric structure is disposed in the plane of the piezoelectric layer and configured to deflect away from the plane of the piezoelectric layer at the second deflection end in response to the acoustic vibrations on the second cantilevered beam.

3. The MEMS transducer of claim 1, further comprising an acoustic port configured to provide an acoustic path from outside the MEMS transducer to the first cantilevered beam and the second cantilevered beam.

4. The MEMS transducer of claim 3, wherein the first protrusion is disposed on a top surface of the first piezoelectric structure parallel to a plane of a piezoelectric layer on an opposite side of the plane of the piezoelectric layer from the acoustic port.

5. The MEMS transducer of claim 4, wherein the first protrusion extends less than one third of a distance from the first deflection end toward the substrate.

6. The MEMS transducer of claim 1, wherein the first deflection end of the piezoelectric structure comprises the first protrusion formed along the outline of the first deflection end and a center region disposed between the outline having a different thickness than the first protrusion.

7. The MEMS transducer of claim 1, wherein the first cantilevered beam further comprises:
   a first electrode layer disposed on a top surface of the first fixed end of the first piezoelectric structure; and a second electrode layer disposed on a bottom surface of the first fixed end of the first piezoelectric structure, wherein the bottom surface is parallel to the top surface of the first fixed end of the first piezoelectric structure on an opposite side of the first piezoelectric structure.

8. The MEMS transducer of claim 7, wherein the first electrode layer and the second electrode layer extends less than two-thirds of a distance from the first fixed end toward the first deflection end.

9. The MEMS transducer of claim 3, wherein the first protrusion is disposed on a bottom surface of the first piezoelectric structure parallel to a plane of a piezoelectric layer on a same side of the plane as the acoustic port, and wherein the first piezoelectric structure is fabricated in the plane of the piezoelectric layer.

10. The MEMS transducer of claim 1, further comprising:

a third cantilevered beam comprising a third protrusion and a third piezoelectric structure, wherein the third piezoelectric structure comprises a third deflection end and a third fixed end, wherein the third fixed end is coupled to the substrate, wherein the third deflection end is cantilevered away from the substrate;

wherein the gap has an initial gap distance between the first fixed end and the second fixed end, and wherein the gap has a gap distance that varies based on a length along the gap away from the substrate;

wherein the first cantilevered beam is separated from the third cantilevered beam by a second gap, wherein the second gap has the initial gap distance between the first fixed end and the third fixed end, and wherein the second gap has a second gap distance that varies based on a second length along the second gap away from the substrate, a deflection position of the first cantilevered beam, and a deflection position of the third cantilevered beam; and wherein the first protrusion further increases the thickness of the first cantilevered beam along the second gap at the first deflection end.

11. The MEMS transducer of claim 10, wherein the first protrusion is disposed on a top surface of the first piezoelectric structure at positions less than a threshold distance from the gap or the second gap.

12. The MEMS transducer of claim 1, further comprising a plurality of cantilevered beams, each comprising a corresponding protrusion and a corresponding piezoelectric structure, wherein each corresponding piezoelectric structure comprises a corresponding deflection end and a corresponding fixed end, wherein each of the plurality of cantilevered beams is separated from a first adjacent cantilevered beam by a first corresponding gap and a second adjacent cantilevered beam by a second corresponding gap.

13. The MEMS transducer of claim 12 wherein the plurality of cantilevered beams and associated gaps between the plurality of cantilevered beams enclose a symmetrical polygonal shape.

14. The MEMS transducer of claim 13, wherein each corresponding piezoelectric structure has a same triangular shape in a shared piezoelectric layer.

15. The MEMS transducer of claim 13, further comprising an acoustic port that provides an acoustic path for sound from outside the MEMS transducer to travel to the plurality of cantilevered beams.

16. The MEMS transducer of claim 15, further comprising a pocket on an opposite side of the plurality of cantilevered beams from the acoustic port, wherein a pressure differential between a pressure of the pocket and a pressure of the acoustic port causes deflections of the plurality of cantilevered beams and an associated generation of electrical signals.

17. The MEMS transducer of claim 1, wherein the gap has an initial gap distance between the first fixed end and the second fixed end, and wherein the gap has a gap distance that varies based on a length along the gap away from a top surface of the substrate;

wherein the initial gap distance is approximately one micrometer (um), and wherein the gap distance at a tip of the first deflection end is approximately 15 um.

18. The MEMS transducer of claim 1, wherein a thickness of the first protrusion and a thickness of the second protrusion is based on a variation in deflection mismatches between positions of the first deflection end and the second deflection end determined from manufacturing variations and material stress of a MEMS transducer design for the MEMS transducer.

19. The MEMS transducer of claim 1, wherein the first cantilevered beam and the second cantilevered beam each comprise electrode layers, the MEMS transducer further comprising control circuitry coupled to the electrode layers and configured to process acoustic signal from acoustic deflections in the first cantilevered beam and the second cantilevered beam.

20. A microelectromechanical (MEMS) transducer, comprising:

a substrate;

a first cantilevered beam comprising a first protrusion and a first piezoelectric structure, wherein the first piezoelectric structure comprises a top surface, a bottom surface, a first side, a first end coupled to the substrate, and a second end cantilevered away from the substrate and the first end; and a second cantilevered beam comprising a second protrusion and a second piezoelectric structure, wherein the second piezoelectric structure comprises a top surface, a bottom surface, a first side, a first end coupled to the substrate and a second end cantilevered away from the substrate and the first end;

wherein the first cantilevered beam is positioned adjacent to the second cantilevered beam separated by a gap between the first side of the first piezoelectric structure and the first side of the second piezoelectric structure, with a corner of the first end of the first cantilevered beam coupled to the substrate separated from a corner of the first end of the second cantilevered beam coupled to the substrate by an initial gap distance, wherein the first side of the first piezoelectric structure and the first side of the second piezoelectric structure are separated by a gap distance;

wherein the first protrusion is positioned on the top surface or the bottom surface of the first piezoelectric structure at the second end of the first piezoelectric structure along a top first side edge of the first cantilevered beam along the gap; and wherein the second protrusion is positioned on the top surface or the bottom surface at the second end of the second piezoelectric structure along a top first side edge of the second cantilevered beam along the gap, wherein the first protrusion covers an outline of a surface of the first piezoelectric structure at a first deflection end of the first piezoelectric structure, and wherein the first protrusion and the second protrusion comprise an inorganic thin-film material to add rigidity.

21. The MEMS transducer of claim 20, further comprising:

a third cantilevered beam comprising a third protrusion and a third piezoelectric structure;

wherein the third piezoelectric structure comprises a top surface, a bottom surface, a first side, a first end coupled to the substrate, and a second end cantilevered away from the substrate and the first end;

wherein the second end of the third cantilevered beam is cantilevered away from the substrate and configured to deflect out of a piezoelectric layer plane in response to acoustic pressure;

wherein the first cantilevered beam is positioned adjacent to the third cantilevered beam separated by a gap between a second side of the first piezoelectric structure and the first side of the third piezoelectric structure, with a second corner of the first end of the first cantilevered beam coupled to the substrate separated from a corner of the first end of the third cantilevered beam coupled to the substrate by a second initial gap distance.

22. The MEMS transducer of claim 20, further comprising a plurality of cantilevered beams, each comprising a corresponding protrusion and a corresponding piezoelectric structure, wherein each corresponding piezoelectric structure comprises a corresponding second end cantilevered away from the substrate and a corresponding first end attached to the substrate, wherein each of the plurality of cantilevered beams is separated from a first adjacent cantilevered beam by a first corresponding gap and a second adjacent cantilevered beam by a second corresponding gap, wherein the plurality of cantilevered beams and associated gaps between the plurality of cantilevered beams enclose a symmetrical polygonal shape, wherein each corresponding piezoelectric structure has a same triangular shape in a shared piezoelectric layer.

* * * * *